(12) United States Patent
Matsuo

(10) Patent No.: US 12,002,826 B2
(45) Date of Patent: Jun. 4, 2024

(54) SOLID-STATE IMAGING ELEMENT AND SOLID-STATE IMAGING APPARATUS

(71) Applicant: SONY SEMICONDUCTOR SOLUTIONS CORPORATION, Kanagawa (JP)

(72) Inventor: Hiroaki Matsuo, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 0 days.

(21) Appl. No.: 18/146,674

(22) Filed: Dec. 27, 2022

(65) Prior Publication Data
US 2023/0326941 A1  Oct. 12, 2023

Related U.S. Application Data

(63) Continuation of application No. 17/653,849, filed on Mar. 7, 2022, now Pat. No. 11,574,941, which is a
(Continued)

(30) Foreign Application Priority Data

Sep. 12, 2016 (JP) .................................. 2016-177311

(51) Int. Cl.
*H01L 27/146* (2006.01)
*H04N 25/60* (2023.01)
(Continued)

(52) U.S. Cl.
CPC .. *H01L 27/14614* (2013.01); *H01L 27/14616* (2013.01); *H01L 27/14638* (2013.01);
(Continued)

(58) Field of Classification Search
CPC .. H04N 25/76; H04N 25/60; H01L 27/14616; H01L 27/14643; H01L 27/14667;
(Continued)

(56) References Cited

U.S. PATENT DOCUMENTS 7,052,635 B2   5/2006  Mischo
10,244,193 B2  3/2019  Goden et al.
(Continued)

FOREIGN PATENT DOCUMENTS

JP   2003-258215 A   9/2003
JP   2011-138927 A   7/2011
(Continued)

OTHER PUBLICATIONS

Notice of Allowance for U.S. Appl. No. 16/327,248, dated Sep. 8, 2020, 18 pages.
(Continued)

*Primary Examiner* — Marly S Camargo
(74) *Attorney, Agent, or Firm* — CHIP LAW GROUP

(57) ABSTRACT

A solid-state imaging element according to an embodiment of the present disclosure includes a first electrode including a plurality of electrodes, a second electrode opposed to the first electrode, and a photoelectric conversion layer provided between the first electrode and the second electrode, and the first electrode has, at least in a portion, an overlap section where the plurality of electrodes overlap each other with a first insulation layer interposed therebetween.

16 Claims, 23 Drawing Sheets

Related U.S. Application Data continuation of application No. 17/126,751, filed on Dec. 18, 2020, now Pat. No. 11,302,728, which is a continuation of application No. 16/327,248, filed as application No. PCT/JP2017/027603 on Jul. 31, 2017, now Pat. No. 10,886,313.

(51) Int. Cl.
  *H04N 25/76* (2023.01)
  *H10K 19/00* (2023.01)
  *H10K 39/32* (2023.01)

(52) U.S. Cl.
  CPC .. *H01L 27/14643* (2013.01); *H01L 27/14647* (2013.01); *H01L 27/14667* (2013.01); *H04N 25/60* (2023.01); *H04N 25/76* (2023.01); *H10K 19/00* (2023.02); *H10K 39/32* (2023.02)

(58) Field of Classification Search
  CPC ........ H01L 27/14638; H01L 27/14647; H10K 19/00; H10K 39/32
  See application file for complete search history.

(56) References Cited

U.S. PATENT DOCUMENTS

| | | | |
|---|---|---|---|
| 10,297,625 | B2 | 5/2019 | Tashiro |
| 10,453,398 | B2 | 10/2019 | Kishi |
| 10,477,121 | B2 | 11/2019 | Machida et al. |
| 10,886,313 | B2 | 1/2021 | Matsuo |
| 11,302,728 | B2 | 4/2022 | Matsuo |
| 11,574,941 | B2 * | 2/2023 | Hiroaki ................. H04N 25/60 |
| 11,621,290 | B2 * | 4/2023 | Kawai .............. H01L 27/14612 |
| 2011/0285883 | A1 | 11/2011 | Goto |
| 2016/0013328 | A1 | 1/2016 | Tashiro et al. |
| 2016/0119562 | A1 | 4/2016 | Takase et al. |
| 2016/0191825 | A1 | 6/2016 | Sato et al. |
| 2018/0151608 | A1 | 5/2018 | Tashiro |
| 2018/0342558 | A1 * | 11/2018 | Hirata ................... H01L 27/307 |
| 2018/0350862 | A1 | 12/2018 | Nakajun et al. |
| 2019/0051684 | A1 | 2/2019 | Takase et al. |
| 2019/0181178 | A1 | 6/2019 | Takase et al. |
| 2020/0120301 | A1 | 4/2020 | Tokuhara et al. |
| 2021/0082987 | A1 | 3/2021 | Kawai et al. |
| 2021/0151524 | A1 | 5/2021 | Tang et al. |
| 2022/0246683 | A1 | 8/2022 | Kataoka et al. |
| 2022/0271070 | A1 * | 8/2022 | Nakazawa ........ H01L 27/14612 |
| 2022/0302020 | A1 | 9/2022 | Okano et al. |

FOREIGN PATENT DOCUMENTS

| | | | |
|---|---|---|---|
| JP | 2016-086407 A | | 5/2016 |
| JP | 2016-127264 A | | 7/2016 |
| JP | 2016127264 A | * | 7/2016 |
| WO | 2016/104177 A1 | | 6/2016 |

OTHER PUBLICATIONS

Non-Final Office Action for U.S. Appl. No. 16/327,248, dated Apr. 23, 2020, 16 pages.

Notice of Allowance for U.S. Appl. No. 17/126,751, dated Dec. 8, 2021, 17 pages.

Non-Final Office Action for U.S. Appl. No. 17/126,751, dated Aug. 13, 2021, 15 pages.

International Search Report and Written Opinion of PCT Application No. PCT/JP2017/027603, dated Oct. 24, 2017, 13 pages of English Translation and 10 pages of ISRWO.

International Preliminary Report on Patentability of PCT Application No. PCT/JP2017/027603, dated Mar. 21, 2019, 14 pages of English Translation and 07 pages of IPRP.

Notice of Allowance for U.S. Appl. No. 17/653,849, dated Oct. 7, 2022, 16 pages.

Notice of Allowance for U.S. Appl. No. 17/653,849, dated Sep. 28, 2022, 20 pages.

* cited by examiner

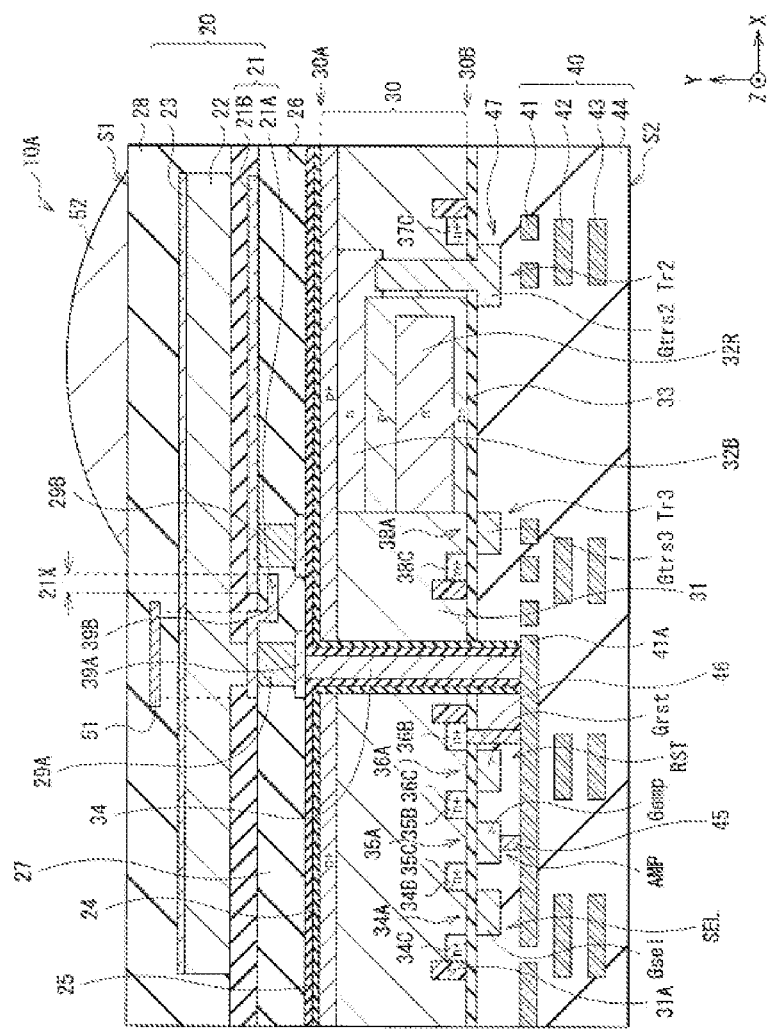
[FIG. 1]

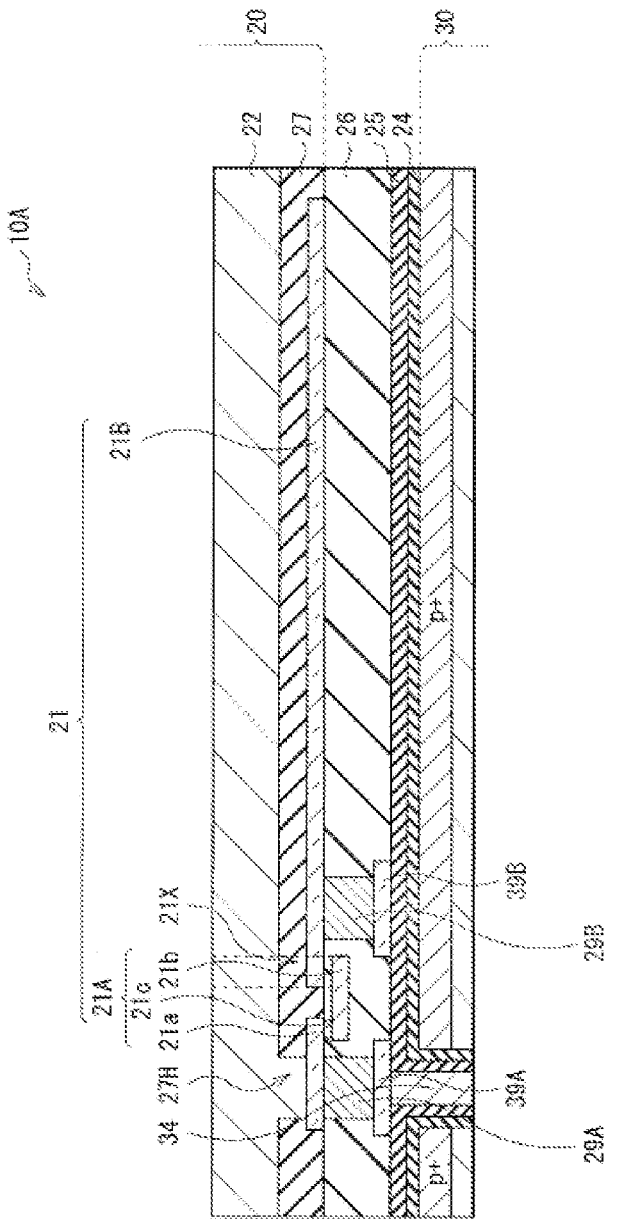
[FIG. 2]

[ FIG. 3 ]
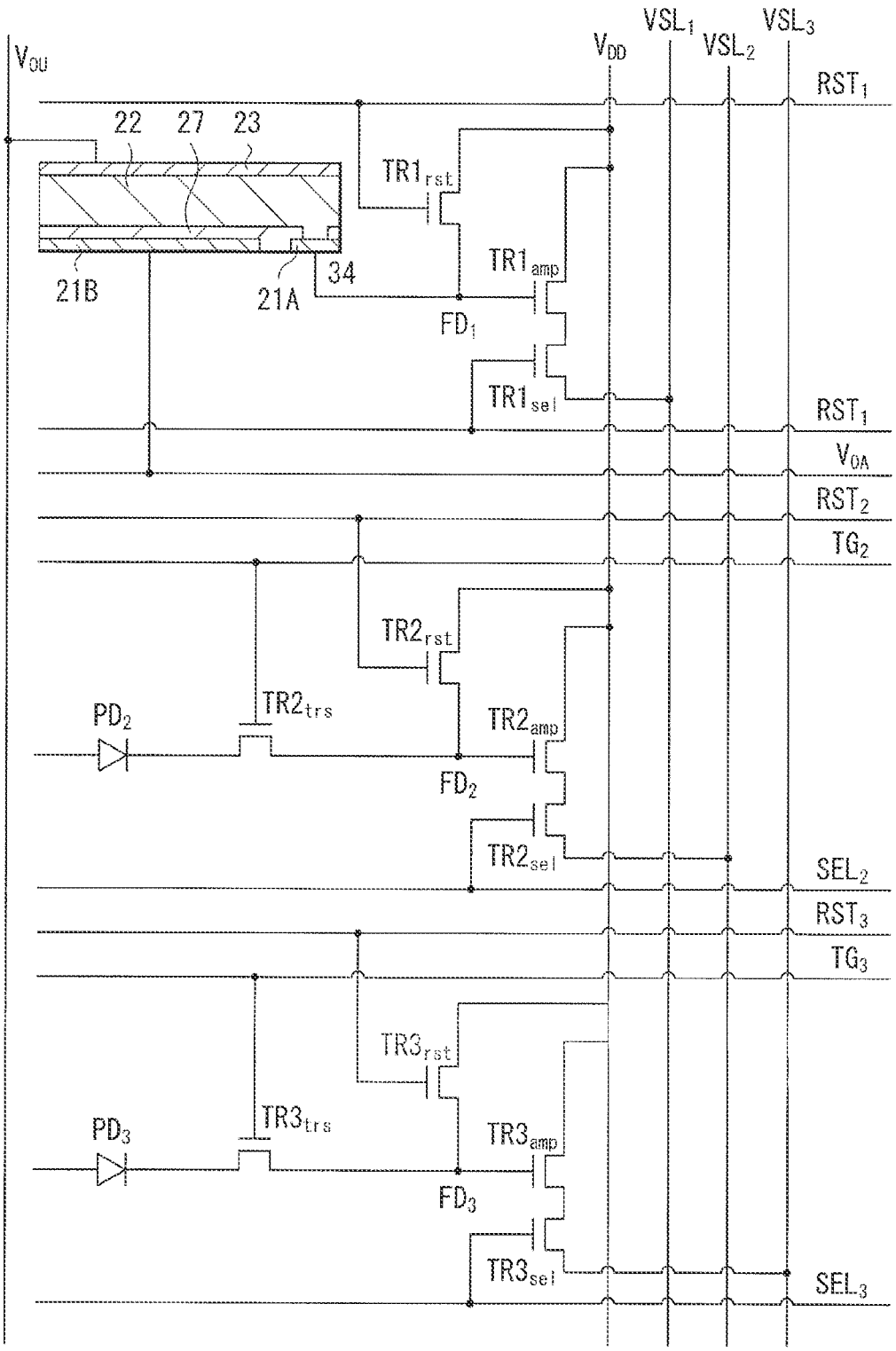

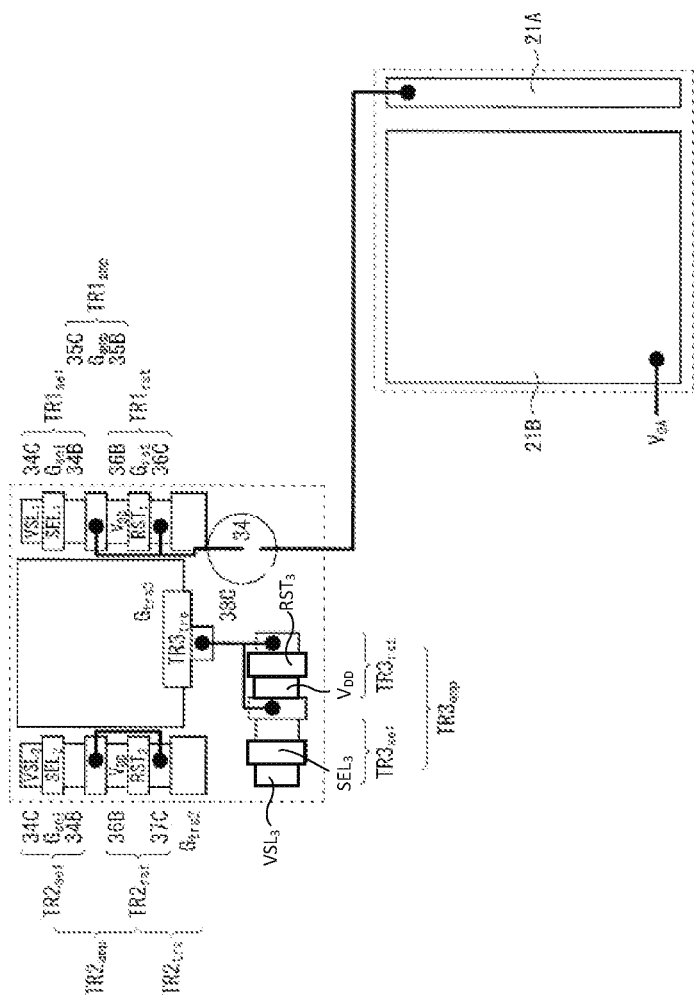
[FIG. 4]

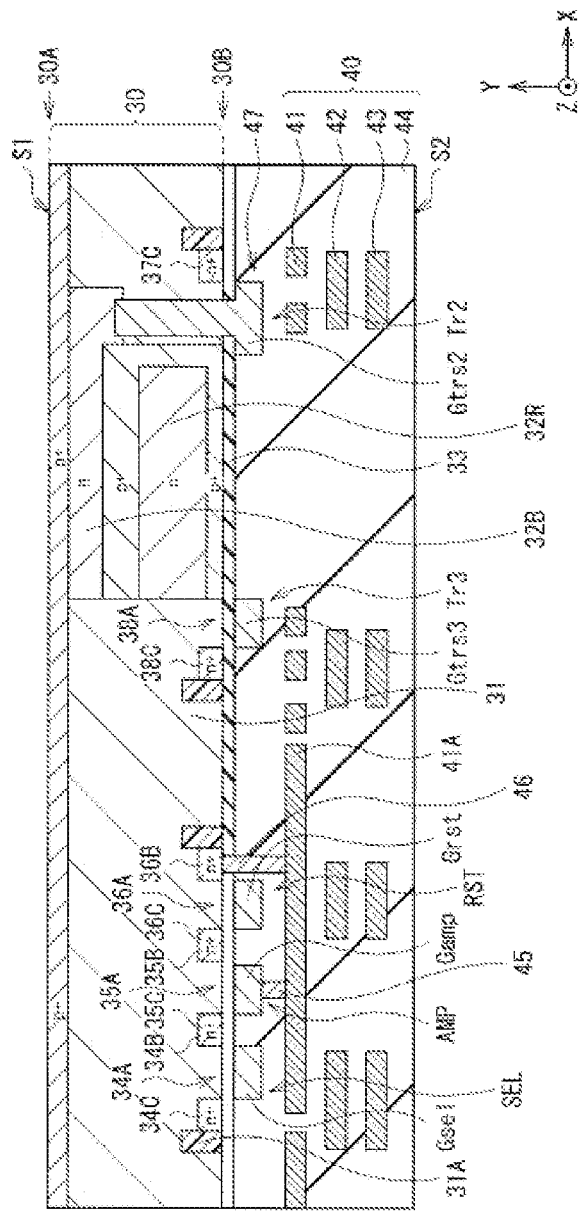
[FIG. 5]

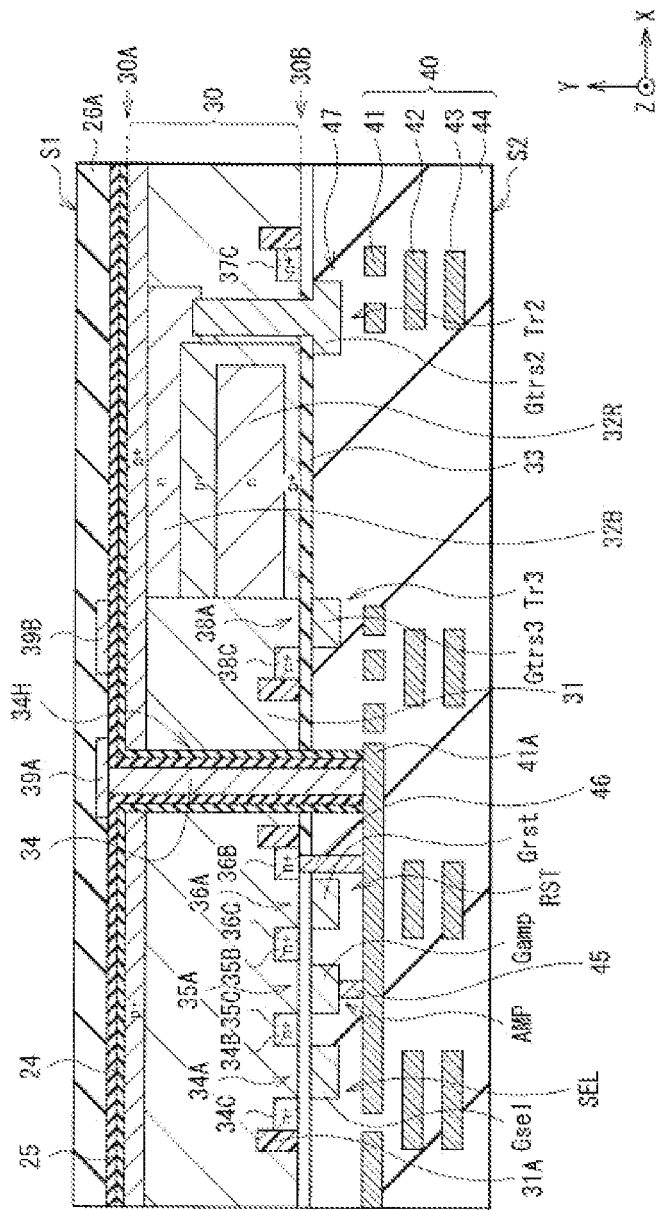
[FIG. 6]

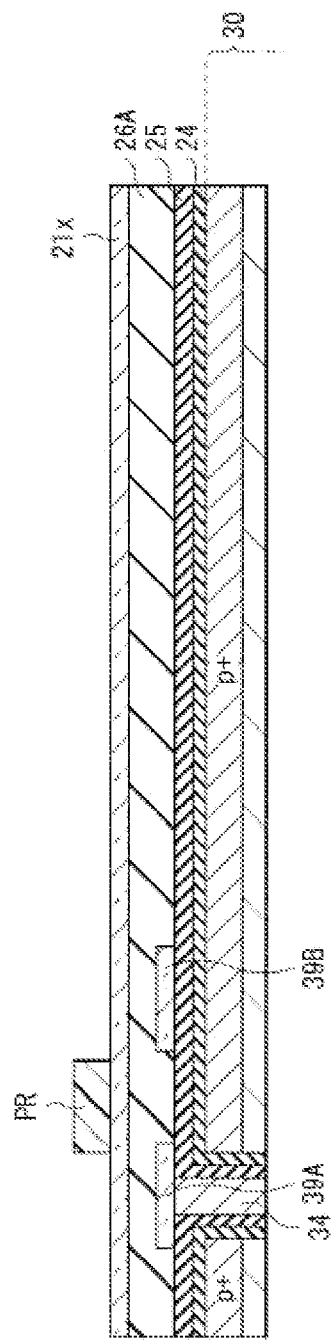
[FIG. 7]

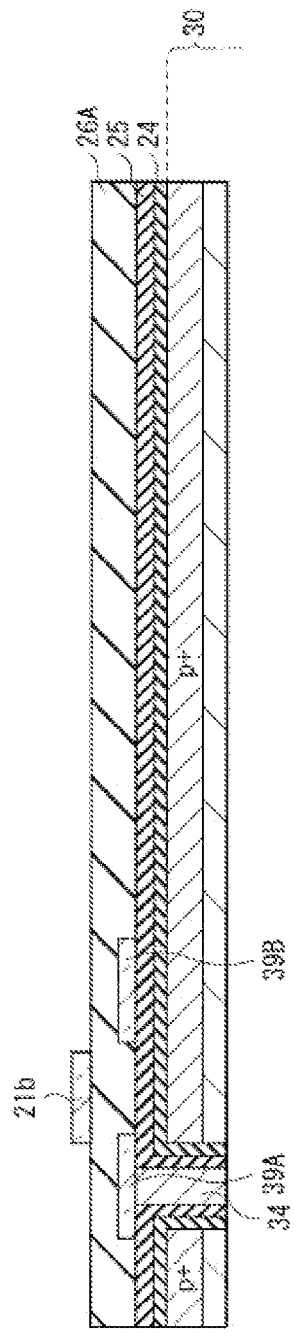
[FIG. 8]

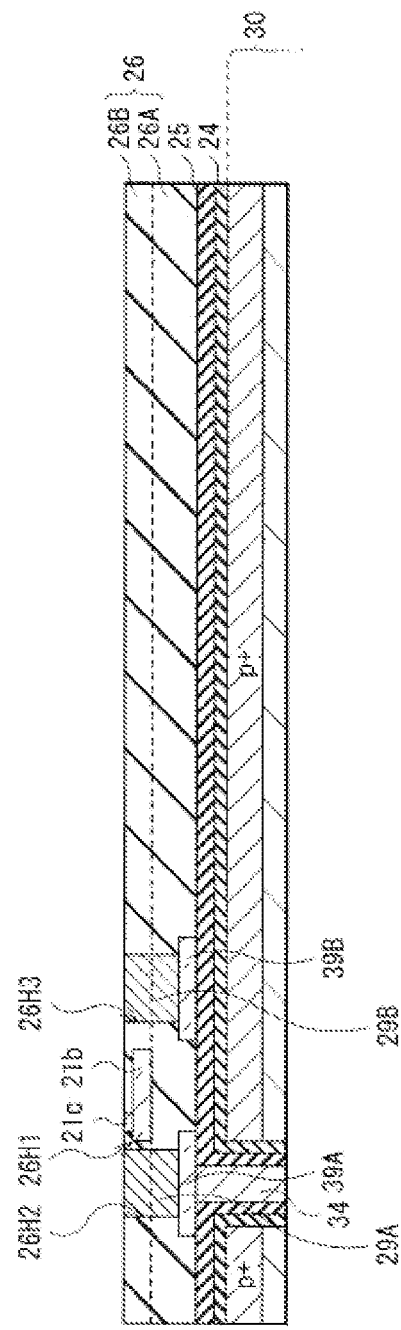
[FIG. 9]

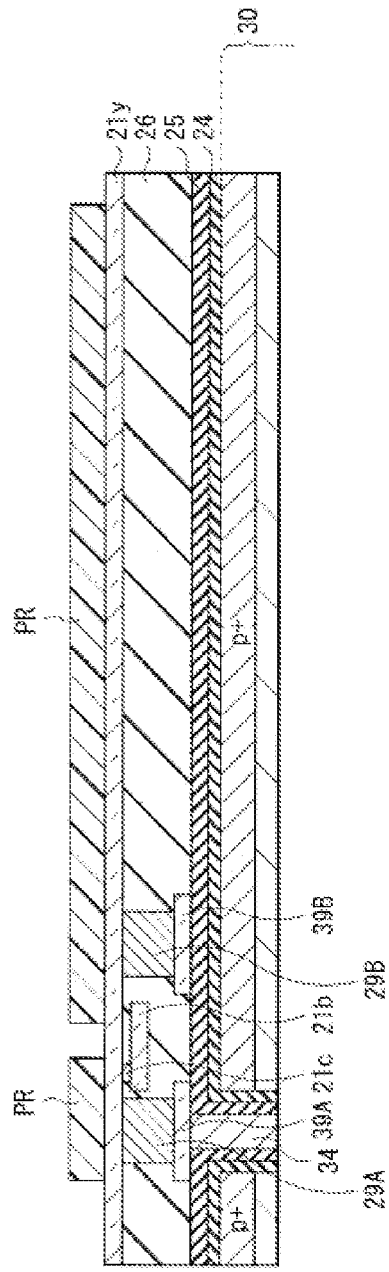
[FIG. 10]

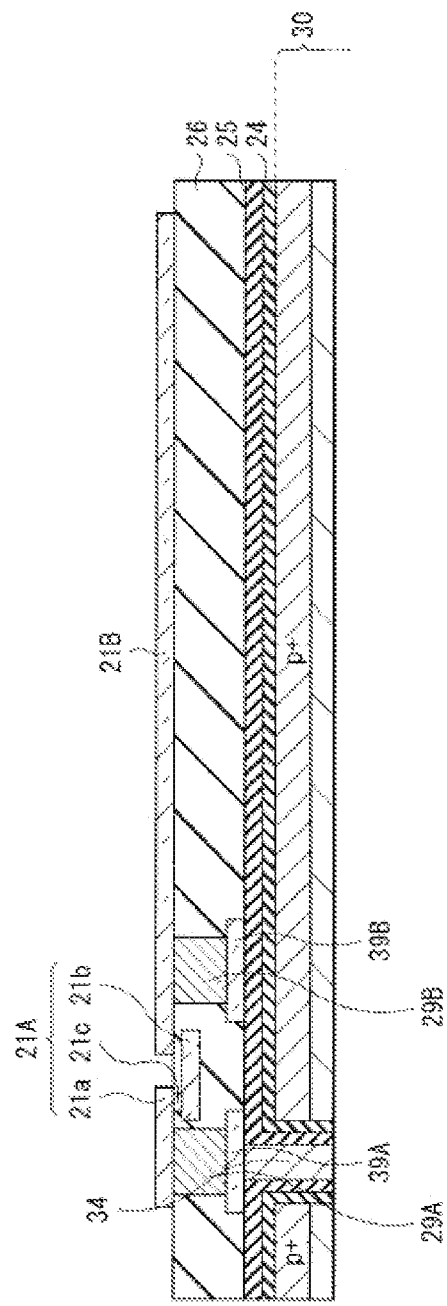
[FIG. 11]

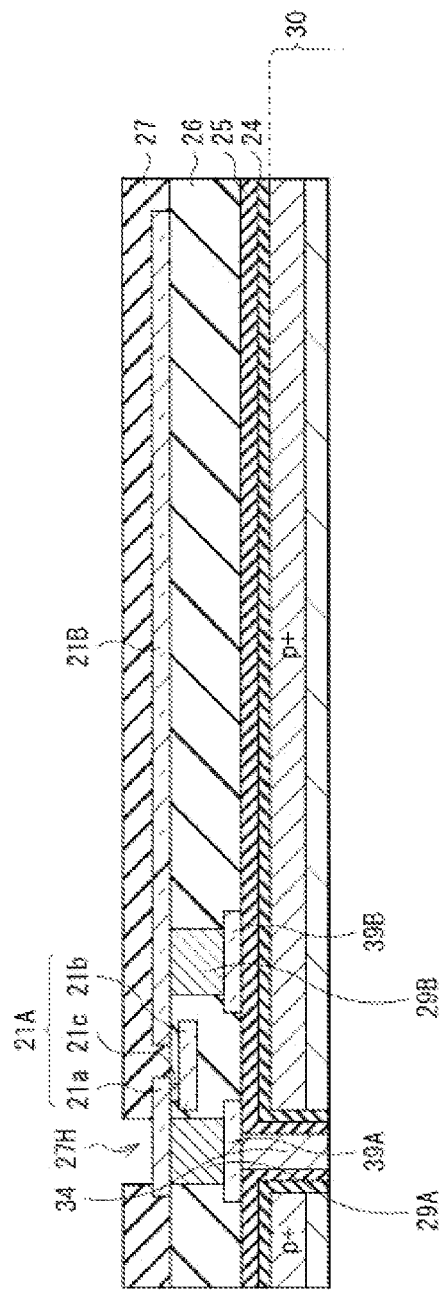
[FIG. 12]

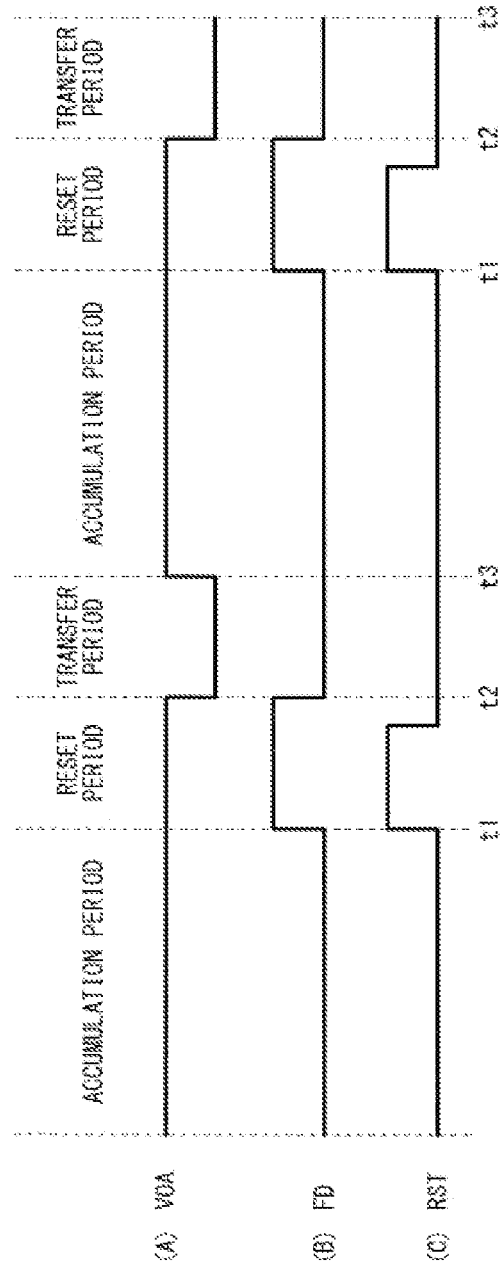
[FIG. 13]

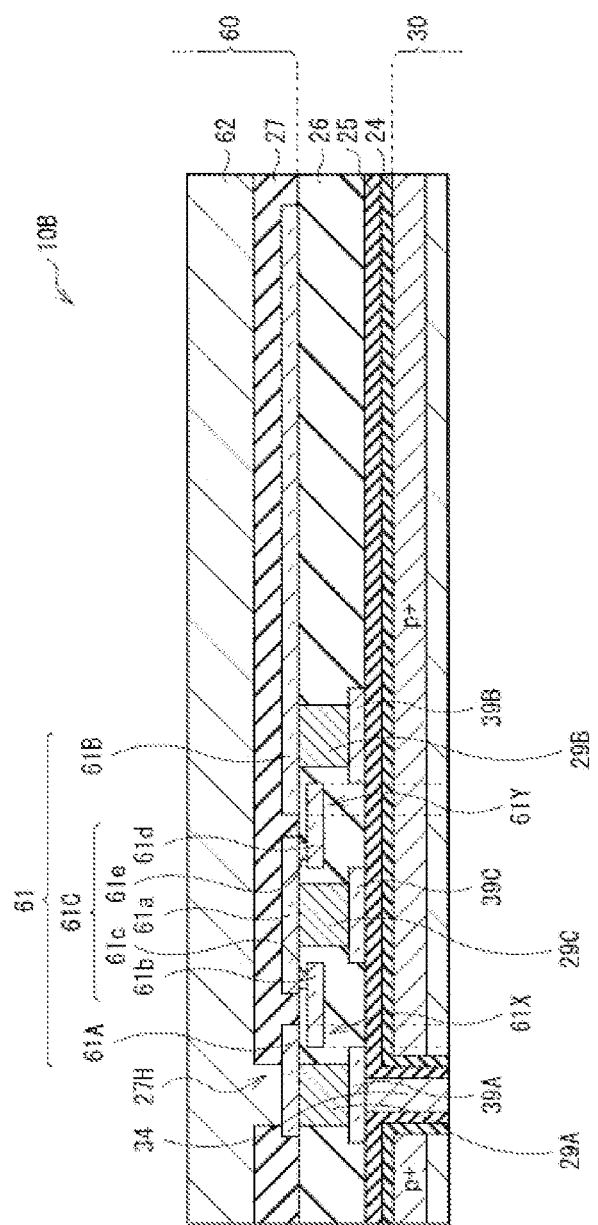
[FIG. 14]

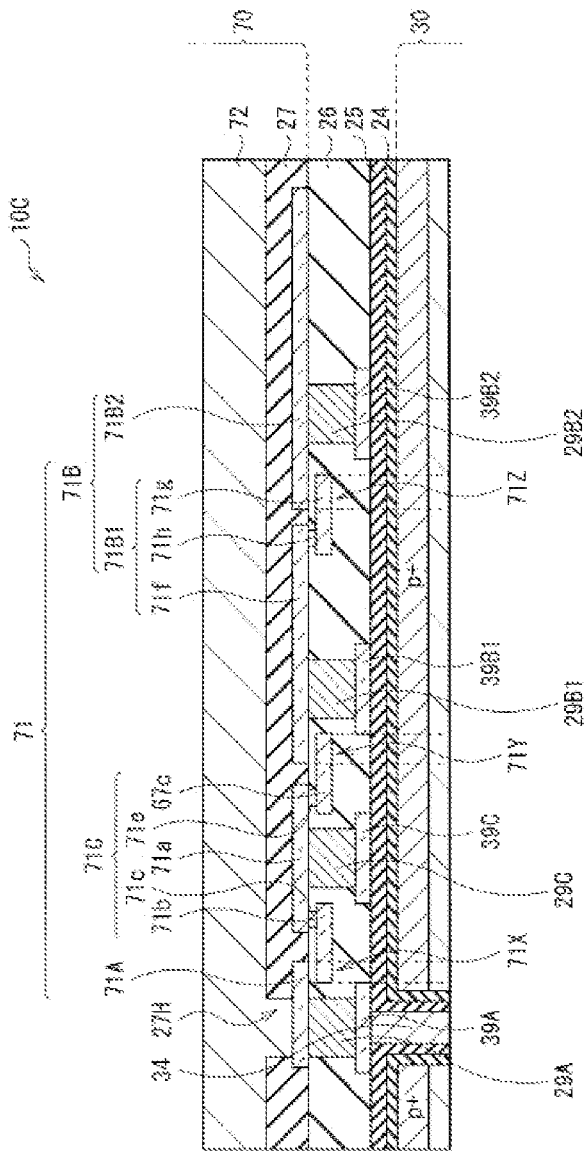
[FIG. 15]

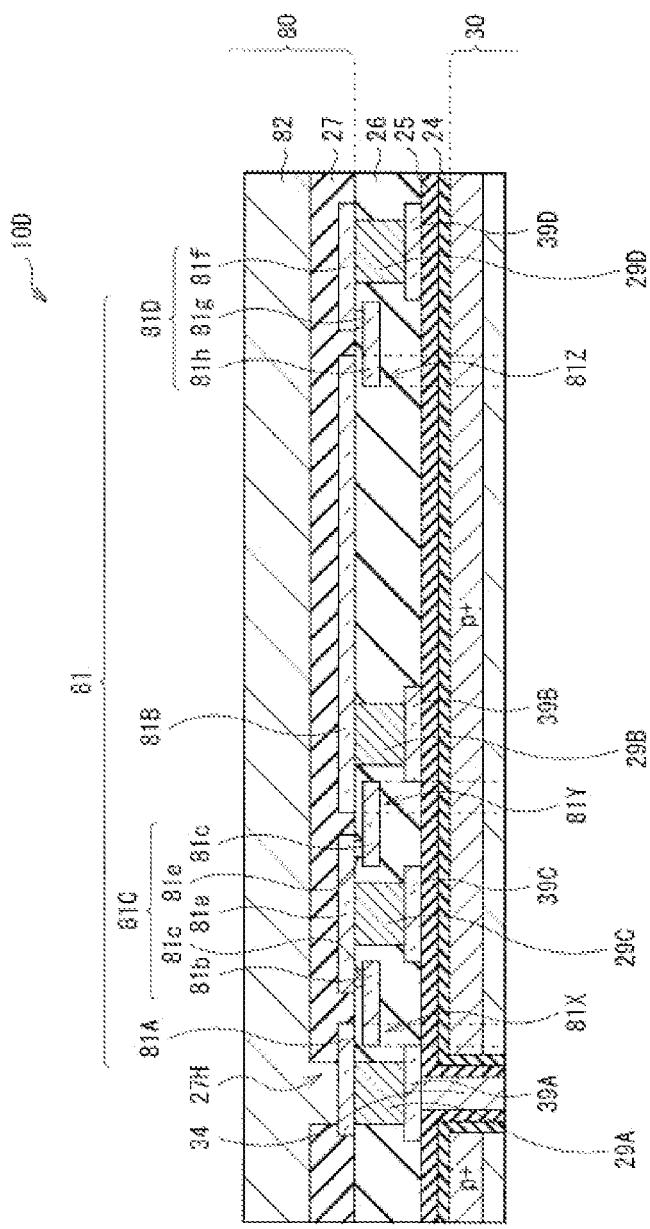
[FIG. 16]

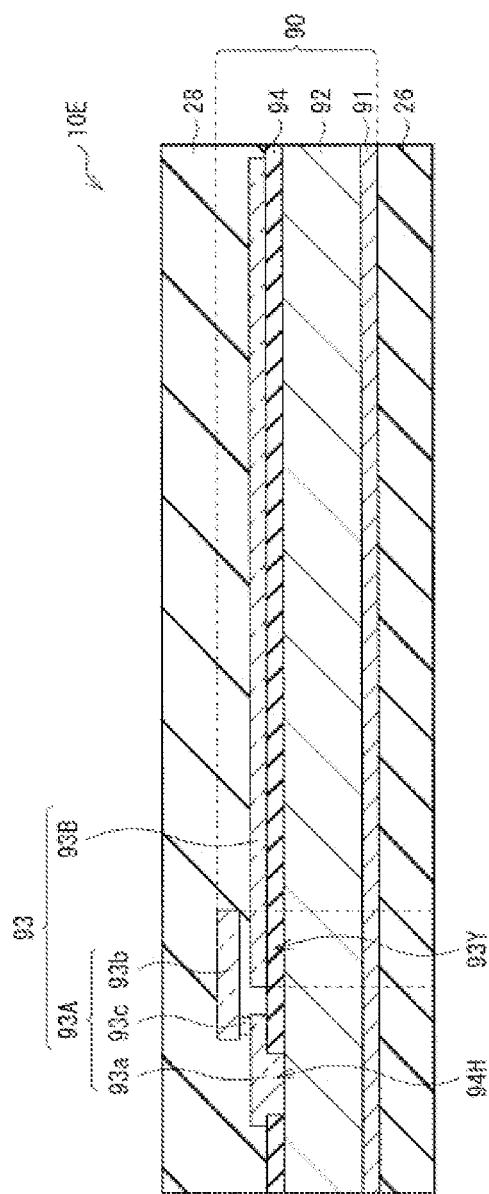
[FIG. 17]

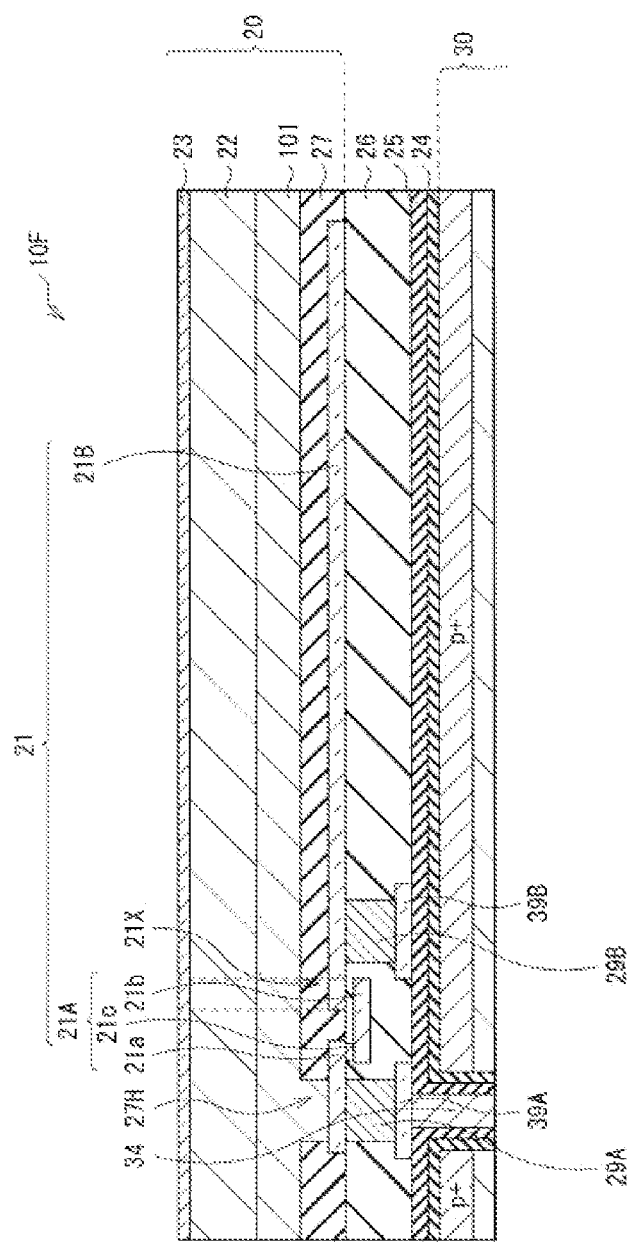
[FIG. 18]

[ FIG. 19 ]
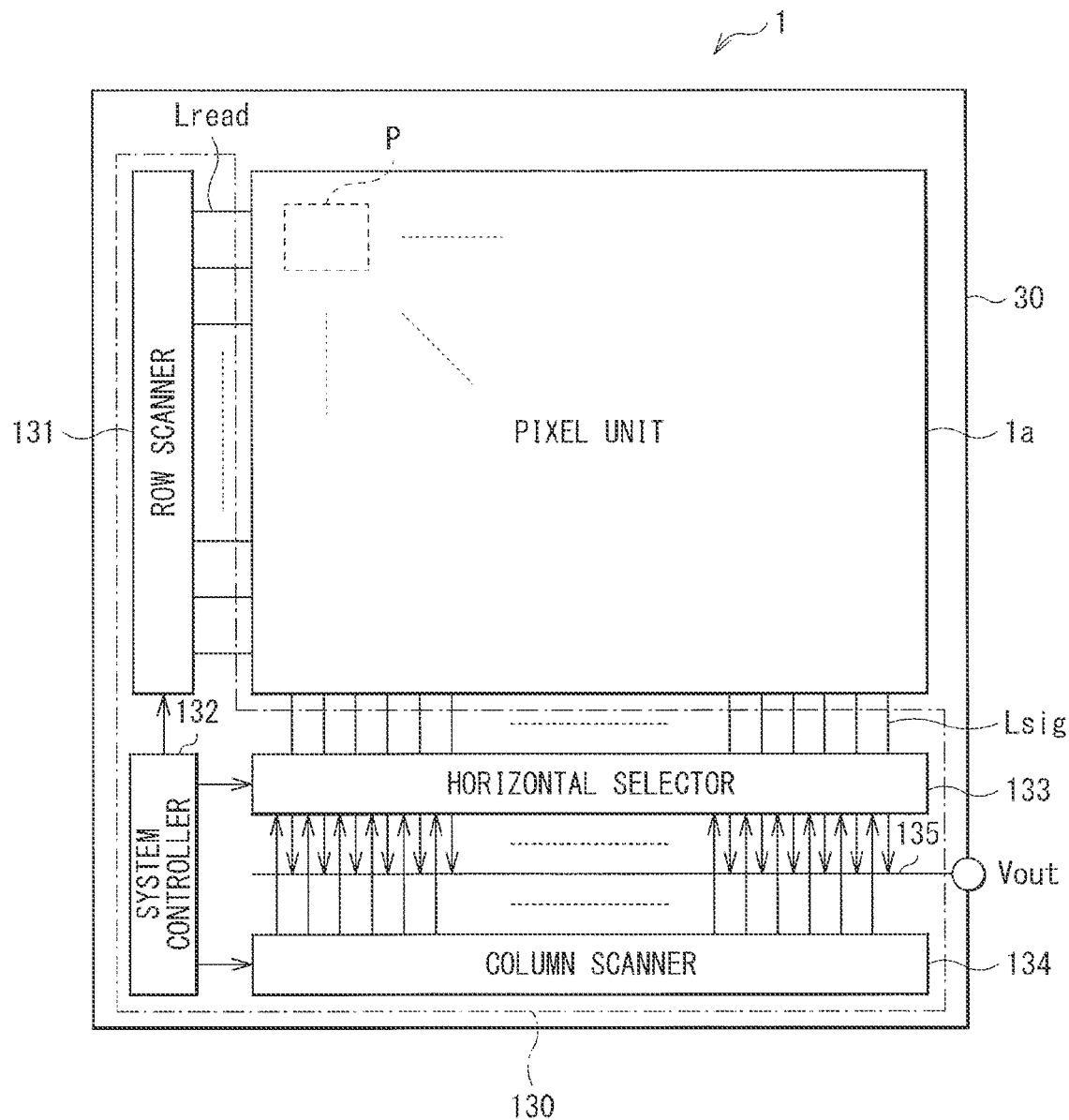

[FIG. 20]
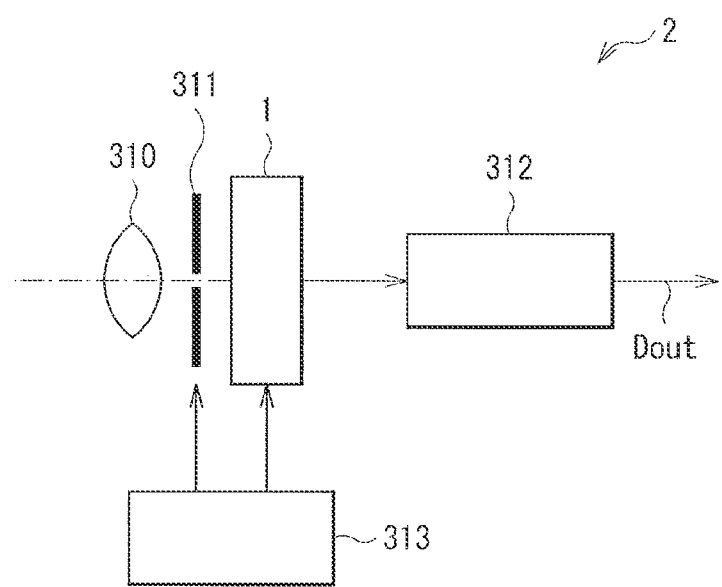

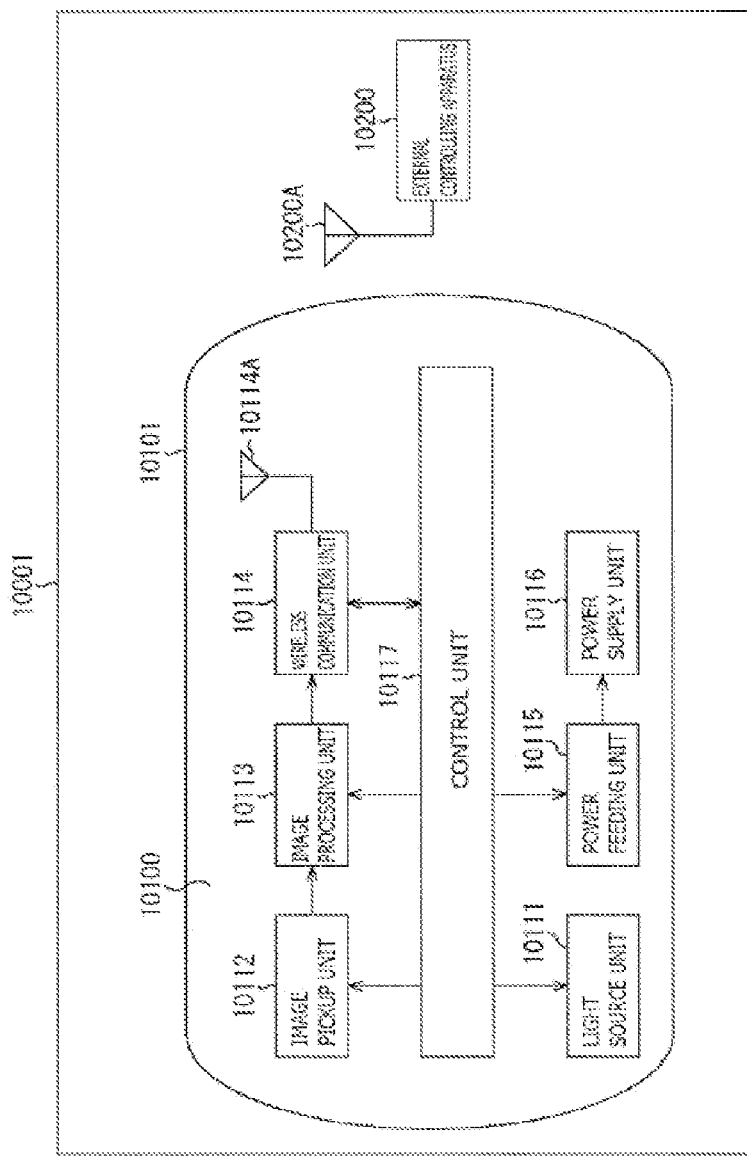
[FIG. 21]

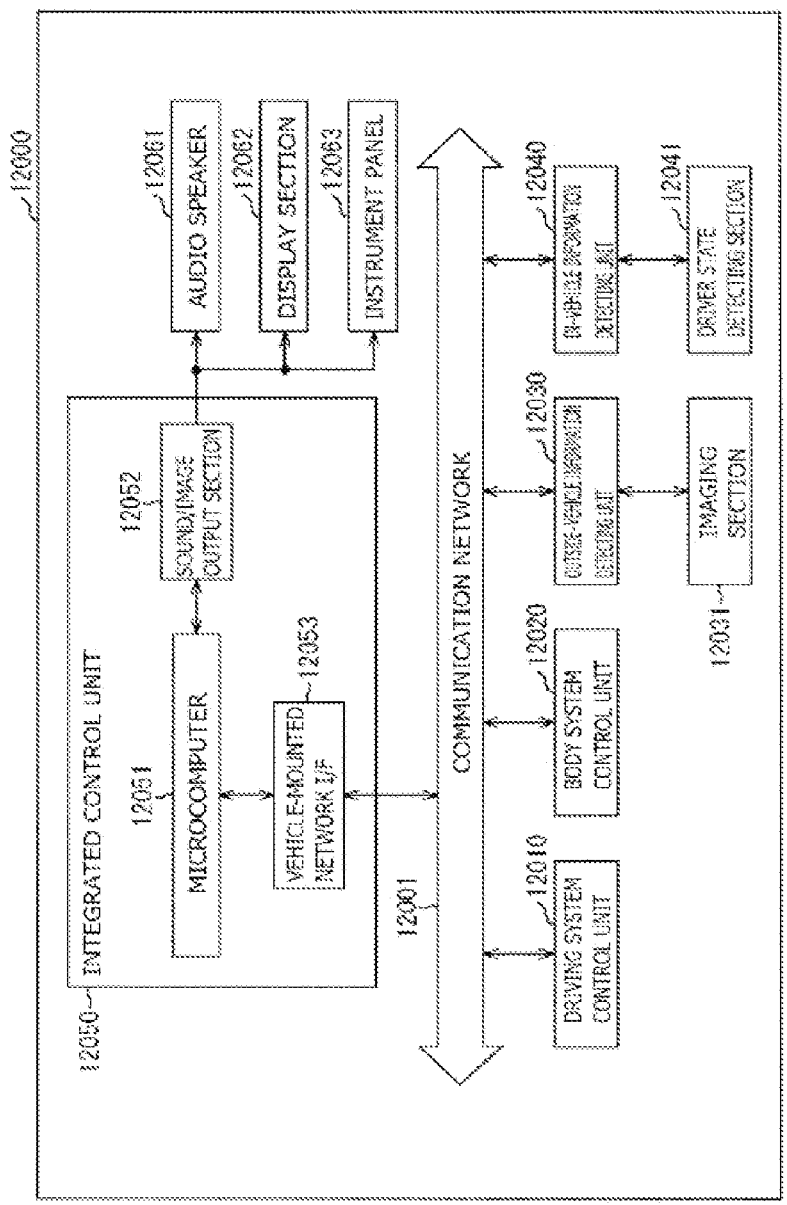
[FIG. 22]

[ FIG. 23 ]
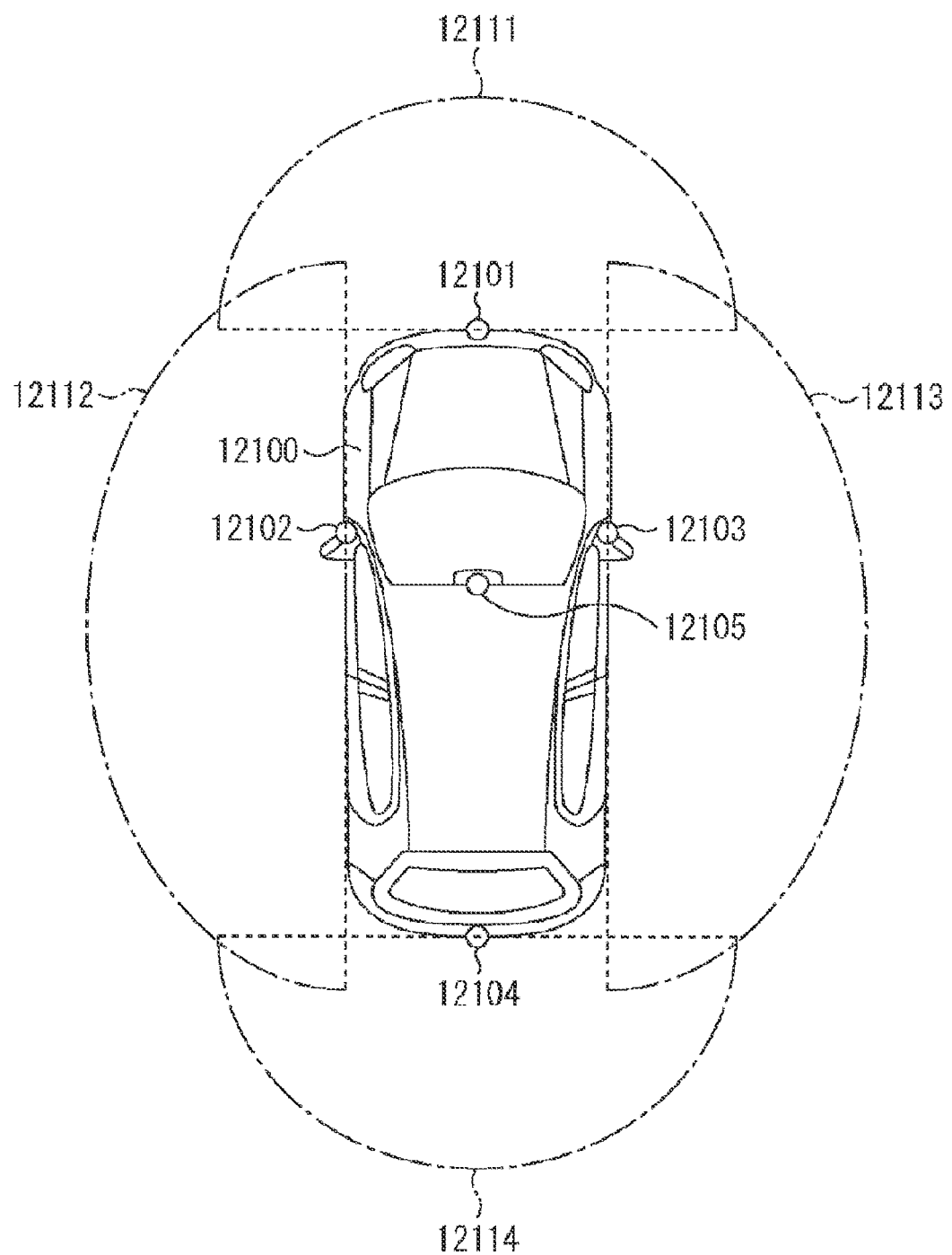

SOLID-STATE IMAGING ELEMENT AND SOLID-STATE IMAGING APPARATUS

CROSS REFERENCE TO RELATED APPLICATIONS

The present application is a continuation application of U.S. patent application Ser. No. 17/653,849, filed Mar. 7, 2022, which is a continuation application of U.S. patent application Ser. No. 17/126,751, filed Dec. 18, 2020, now U.S. Pat. No. 11,302,728, which is a continuation application of U.S. patent application Ser. No. 16/327,248, filed Feb. 21, 2019, now U.S. Pat. No. 10,886,313 which is a National Stage of PCT/JP2017/027603, filed Jul. 31, 2017, and which claims the priority from prior Japanese Patent Application JP 2016-177311, filed Sep. 12, 2016, the entire content of which is hereby incorporated by reference.

TECHNICAL FIELD

The present disclosure relates to a solid-state imaging element using, for example, an organic semiconductor material, and a solid-state imaging apparatus including the solid-state imaging element.

BACKGROUND ART

In recent years, in a solid-state imaging apparatus such as a CCD (Charge Coupled Device) image sensor or a CMOS (Complementary Metal Oxide Semiconductor) image sensor, miniaturization of pixel size has been under way. This causes a reduction in the number of photons entering a unit pixel, thereby resulting in reduced sensitivity and a lower S/N ratio. Moreover, in a case where a color filter including two-dimensionally arranged primary color filters of red, green, and blue is used for colorization, for example, green light and blue light are absorbed by the color filter in a red pixel, thereby leading to reduced sensitivity. Further, upon generation of a signal of each color, interpolation processing is performed between the pixels, thereby generating a false color.

Hence, for example, PTL 1 discloses a solid-state imaging apparatus in which photoelectric conversion regions each photoelectrically converting light in a corresponding one of a red wavelength range, a green wavelength range, and a blue wavelength range are stacked. In this solid-state imaging apparatus, light in the red wavelength range and light in the blue wavelength range are photoelectrically converted by respective photoelectric converters (photodiodes PD1 and PD2) formed inside a semiconductor substrate, and light in the green wavelength range is photoelectrically converted by an organic photoelectric conversion film formed on a back surface side of the semiconductor substrate. In this solid-state imaging apparatus, an improvement in sensitivity is achieved through separately extracting signals of B/G/R from one pixel.

CITATION LIST

Patent Literature

PTL 1: Japanese Unexamined Patent Application Publication No. 2011-138927

SUMMARY OF THE INVENTION

Incidentally, a solid-state imaging apparatus is desired to improve imaging characteristics.

It is desirable to provide a solid-state imaging element that allows for an improvement in imaging characteristics and a solid-state imaging apparatus including the solid-state imaging element.

A solid-state imaging element according to an embodiment of the present disclosure includes: a first electrode including a plurality of electrodes; a second electrode opposed to the first electrode; and a photoelectric conversion layer provided between the first electrode and the second electrode, and the first electrode has, at least in a portion, an overlap section where the plurality of electrodes overlap each other with a first insulation layer interposed therebetween.

A solid-state imaging apparatus according to an embodiment of the present disclosure includes, in each of a plurality of pixels, one or a plurality of solid-state imaging elements according to the foregoing embodiment of the present disclosure.

In the solid-state imaging element according to the embodiment of the present disclosure and the solid-state imaging apparatus according to the embodiment of the present disclosure, the first electrode includes the plurality of electrodes, and the overlap section in which the plurality of electrodes at least partially overlap each other with the first insulation layer interposed therebetween is formed. This makes it possible to improve transfer efficiency of charges generated by photoelectric conversion.

According to the solid-state imaging element according to the embodiment of the present disclosure and the solid-state imaging apparatus according to the embodiment of the present disclosure, the first electrode includes the plurality of electrodes, and the overlap section in which the plurality of electrodes overlap each other with the first insulation layer interposed therebetween is formed between the plurality of electrodes; therefore, transfer efficiency of charges generated by photoelectric conversion is improved. This makes it possible to improve imaging characteristics.

It is to be noted that effects described here are not necessarily limited and may include any of effects described in the present disclosure.

BRIEF DESCRIPTION OF THE DRAWINGS

FIG. 1 is a cross-sectional view of an example of a schematic configuration of a solid-state imaging element according to a first embodiment of the present disclosure.

FIG. 2 is a cross-sectional view for description of a configuration of a main part of the solid-state imaging element illustrated in FIG. 1.

FIG. 3 is an equivalent circuit diagram of the solid-state imaging element illustrated in FIG. 1.

FIG. 4 is a schematic view of a layout of a lower electrode and transistors included in a controller in the solid-state imaging element illustrated in FIG. 1.

FIG. 5 is a cross-sectional view for description of a method of manufacturing the solid-state imaging element illustrated in FIG. 1.

FIG. 6 is a cross-sectional view of a process following FIG. 5.

FIG. 7 is a cross-sectional view of a process following FIG. 6.

FIG. 8 is a cross-sectional view of a process following FIG. 7.

FIG. 9 is a cross-sectional view of a process following FIG. 8.

FIG. 10 is a cross-sectional view of a process following FIG. 9.

FIG. 11 is a cross-sectional view of a process following FIG. 10.

FIG. 12 is a cross-sectional view of a process following FIG. 11.

FIG. 13 is a timing chart illustrating an operation example of the solid-state imaging element illustrated in FIG. 1.

FIG. 14 is a cross-sectional view of a configuration of a main part of a solid-state imaging element according to a second embodiment of the present disclosure.

FIG. 15 is a cross-sectional view of a configuration of a main part of a solid-state imaging element according to a third embodiment of the present disclosure.

FIG. 16 is a cross-sectional view of a configuration of a main part of a solid-state imaging element according to a fourth embodiment of the present disclosure.

FIG. 17 is a cross-sectional view of a configuration of a main part of a solid-state imaging element according to a fifth embodiment of the present disclosure.

FIG. 18 is a cross-sectional view of a configuration of a main part of a solid-state imaging element according to a modification example of the present disclosure.

FIG. 19 is a block diagram illustrating a configuration of a solid-state imaging apparatus using the solid-state imaging element illustrated in FIG. 1, etc. as a pixel.

FIG. 20 is a functional block diagram illustrating an example of an electronic apparatus (a camera) using the solid-state imaging apparatus illustrated in FIG. 19.

FIG. 21 is a block diagram depicting an example of a schematic configuration of an in-vivo information acquisition system.

FIG. 22 is a block diagram depicting an example of schematic configuration of a vehicle control system.

FIG. 23 is a diagram of assistance in explaining an example of an installation position of an imaging section.

MODES FOR CARRYING OUT THE INVENTION

In the following, some embodiments of the present disclosure are described in detail with reference to the drawings. The following description is given of specific examples of the present disclosure, and the present disclosure is not limited to the following embodiments. Moreover, the present disclosure is not limited to positions, dimensions, dimension ratios, etc. of respective components illustrated in the respective drawings. It is to be noted that description is given in the following order.

1. First Embodiment (an example in which an overlap section is formed between a readout electrode and an accumulation electrode)
   1-1. Configuration of Solid-state Imaging Element
   1-2. Method of Manufacturing Solid-state Imaging Element
   1-3. Workings and Effects
2. Second Embodiment (an example in which a transfer electrode is provided)
3. Third Embodiment (an example in which an accumulation electrode is divided)
4. Fourth Embodiment (an example in which a discharging electrode is provided)
5. Fifth Embodiment (an example in which an upper electrode is divided)
6. Modification Example (an example in which a semiconductor layer is provided between a lower electrode and a photoelectric conversion layer)
7. Application Examples

1. FIRST EMBODIMENT

FIG. 1 illustrates a cross-sectional configuration of a solid-state imaging element (a solid-state imaging element 10A) according to a first embodiment of the present disclosure. FIG. 2 illustrates an enlarged cross-sectional configuration of a main part (an organic photoelectric converter 20 and its surroundings) of the solid-state imaging element 10A. FIG. 3 is an equivalent circuit diagram of the solid-state imaging element 10A illustrated in FIG. 1. FIG. 4 schematically illustrates a layout of a lower electrode 21 and transistors included in a controller in the solid-state imaging element 10A illustrated in FIG. 1. The solid-state imaging element 10A configures one pixel (a unit pixel P) in a solid-state imaging apparatus (a solid-state imaging apparatus 1; refer to FIG. 19) such as a CMOS image sensor used in an electronic apparatus such as a digital still camera or a video camera, for example.

(1-1. Configuration of Solid-State Imaging Element)

The solid-state imaging element 10A is of a so-called longitudinal spectral type in which, for example, one organic photoelectric converter 20 and two inorganic photoelectric converters 32B and 32R are stacked in a longitudinal direction. The organic photoelectric converter 20 is provided on a side on which a first surface (back side) 30A is located of a semiconductor substrate 30. The inorganic photoelectric converters 32B and 32R are formed to be embedded in the semiconductor substrate 30, and are stacked in a thickness direction of the semiconductor substrate 30. The organic photoelectric converter 20 includes a photoelectric conversion layer 22 formed with use of an organic material between a lower electrode 21 (a first electrode) and an upper electrode 23 (a second electrode) that are opposed to each other. The photoelectric conversion layer 22 includes a p-type semiconductor and an n-type semiconductor, and has a bulk heterojunction structure in a layer. The bulk heterojunction structure is a p/n junction surface formed through mixture of the p-type semiconductor and the n-type semiconductor. In the present embodiment, the lower electrode 21 disposed on a side opposite to a light entering side S1 with respect to the photoelectric conversion layer 22 includes a plurality of electrodes (a readout electrode 21A and an accumulation electrode 21B). The lower electrode 21 has a configuration in which an overlap section 21X where the readout electrode 21A and the accumulation electrode 21B overlap each other with an insulation layer (an interlayer insulation layer 26) interposed therebetween is provided between the readout electrode 21A and the accumulation electrode 21B.

The organic photoelectric converter 20 and the inorganic photoelectric converters 32B and 32R selectively detect light in mutually different wavelength ranges to perform photoelectric conversion. Specifically, the organic photoelectric converter 20 acquires a green (G) color signal. The inorganic photoelectric converters 32B and 32R respectively acquire a blue (B) color signal and a red (R) color signal by a difference in absorption coefficient. This allows the solid-state imaging element 10A to acquire a plurality of color signals in one pixel without using a color filter.

It is to be noted that in the present embodiment, description is given of a case where electrons of electron-hole pairs generated by photoelectric conversion are read as signal charges (a case where an n-type semiconductor region serves as a photoelectric conversion layer). Moreover, in the drawings, "+(plus)" attached to "p" or "n" indicates that p-type or n-type impurity concentration is high, and "++" indicates that p-type or n-type impurity concentration is higher than that in a case of "+".

For example, floating diffusions (floating diffusion layers) FD1 (a region 36B in the semiconductor substrate 30), FD2 (a region 37C in the semiconductor substrate 30), and FD3

(a region 38C in the semiconductor substrate 30), transfer transistors Tr1 and Tr2, an amplifier transistor (modulation element) AMP, a reset transistor RST, a select transistor SEL, and multilayer wiring 40 are provided on a second surface (a front surface) 30B of the semiconductor substrate 30. The multilayer wiring 40 has a configuration in which wiring layers 41, 42, and 43 are stacked in an insulation layer 44.

It is to be noted that in the drawings, the side on which the first surface 30A is located of the semiconductor substrate 30 is represented as the light entering side S1 and a side on which the second surface 30B is located of the semiconductor substrate 30 is represented as a wiring layer side S2.

The organic photoelectric converter 20 has a configuration in which, for example, the lower electrode 21, the photoelectric conversion layer 22, and the upper electrode 23 are stacked in this order from the side on which the first surface 30A is located of the semiconductor substrate 30. Moreover, an insulation layer 27 is provided between the lower electrode 21 and the photoelectric conversion layer 22. The lower electrode 21 is formed separately for each solid-state imaging element 10A, for example, and includes the readout electrode 21A and the accumulation electrode 21B that are separated from each other with the insulation layer 27 interposed therebetween, as described in detail later. The readout electrode 21A of the lower electrode 21 is electrically coupled to the photoelectric conversion layer 22 through an opening 27H provided in the insulation layer 27. FIG. 1 illustrates an example in which the photoelectric conversion layer 22 and the upper electrode 23 are formed separately for each solid-state imaging element 10A; however, the photoelectric conversion layer 22 and the upper electrode 23 may be provided as a continuous layer common to a plurality of solid-state imaging elements 10A. For example, a layer having fixed charges (a fixed charge layer) 24, a dielectric layer 25 having an insulating property, and an inter-layer insulation layer 26 are provided between the first surface 30A of the semiconductor substrate 30 and the lower electrode 21. A protective layer 28 is provided on the upper electrode 23. For example, a light-shielding film 51 is provided above the readout electrode 21A in the protective layer 28. It is sufficient if the light-shielding film 51A is provided to cover a region of the readout electrode 21A directly in contact with at least the photoelectric conversion layer 22 without covering at least the accumulation electrode 21B. For example, the light-shielding film 51A is preferably provided to be a size larger than an electrically conductive film 21a that is formed in the same layer as the accumulation electrode 21B. Optical members such as a planarization layer (not illustrated) and an on-chip lens 52 are disposed above the protective layer 28.

A through electrode 34 is provided between the first surface 30A and the second surface 30B of the semiconductor substrate 30. The organic photoelectric converter 20 is coupled, through the through electrode 34, to a gate Gamp of the amplifier transistor AMP and one source-drain region 36B of the reset transistor RST (a reset transistor Tr1rst) also serving as the floating diffusion FD1. This allows the solid-state imaging element 10A to well transfer charges (herein, electrons) generated in the organic photoelectric converter 20 on the side on which the first surface 30A is located of the semiconductor substrate 30 to the side on which the second surface 30B is located of the semiconductor substrate 30 through the through electrode 34, thereby improving characteristics.

A lower end of the through electrode 34 is coupled to a coupling section 41A in the wiring layer 41, and the coupling section 41A and the gate Gamp of the amplifier transistor AMP are coupled to each other through a first lower contact 45. The coupling section 41A and the floating diffusion FD1 (the region 36B) are coupled to each other through a second lower contact 46, for example. An upper end of the through electrode 34 is coupled to the readout electrode 21A through a pad section 39A and a first upper contact 29A, for example.

The through electrode 34 is provided for each organic photoelectric converter 20 in each of the solid-state imaging elements 10A, for example. The through electrode 34 has a function as a connector between the organic photoelectric converter 20 and both the gate Gamp of the amplifier transistor AMP and the floating diffusion FD1, and serves as a transmission path of the charges (herein, the electrons) generated in the organic photoelectric converter 20.

A reset gate Grst of the reset transistor RST is disposed adjacent to the floating diffusion FD1 (the one source-drain region 36B of the reset transistor RST). This makes it possible to reset charges accumulated in the floating diffusion FD1 by the reset transistor RST.

In the solid-state imaging element 10A according to the present embodiment, light entering the organic photoelectric converter 20 from a side on which the upper electrode 23 is located is absorbed by the photoelectric conversion layer 22. Excitons thereby generated move to an interface between an electron donor and an electron acceptor included in the photoelectric conversion layer 22, and the excitons are dissociated, that is, the excitons are dissociated to electrons and holes. Charges generated herein (the electrons and the holes) are each carried to different electrodes by diffusion resulting from a difference in concentration between carriers or an internal electric field resulting from a difference in work function between an anode (herein, the upper electrode 23) and a cathode (herein, the lower electrode 21), and detected as a photocurrent. Moreover, it is also possible to control transport directions of the electrons and the holes by application of a potential between the lower electrode 21 and the upper electrode 23.

In the following, description is given of the configurations, materials, etc. of respective components.

The organic photoelectric converter 20 is an organic photoelectric conversion element that absorbs green light corresponding to a portion or the entirety of a selective wavelength range (for example, from 450 nm to 650 nm both inclusive) to generate the electron-hole pairs.

The lower electrode 21 includes the readout electrode 21A and the accumulation electrode 21B that are separately formed, as described above. The readout electrode 21A transfers charges (herein, electrons) generated in the photoelectric conversion layer 22 to the floating diffusion FD1, and is coupled to the floating diffusion FD1 through the first upper contact 29A, the pad section 39A, the through electrode 34, the coupling section 41A, and the second lower contact 46, for example. The accumulation electrode 21B accumulates, in the photoelectric conversion layer 22, the electrons as signal charges of the charges generated in the photoelectric conversion layer 22. The accumulation electrode 21B is directly opposed to light receiving surfaces of the inorganic photoelectric converters 32B and 32R formed in the semiconductor substrate 30, and is provided in a region covering the light receiving surfaces. The accumulation electrode 21B is preferably larger than the readout electrode 21A, which makes it possible to accumulate a large number of charges.

In the present embodiment, the lower electrode 21 has, between the readout electrode 21A and the accumulation electrode 21B, the overlap section 21X where the readout electrode 21A and the accumulation electrode 21B overlap each other in a thickness direction (a Y-axis direction). The overlap section 21X is configured through extending a portion of the readout electrode 21A toward below the adjacent accumulation electrode 21B and stacking the portion of the readout electrode 21A with the inter-layer insulation layer 26 interposed therebetween. Specifically, the readout electrode 21A includes an electrically-conductive film 21a provided on the inter-layer insulation layer 26, an electrically-conductive film 21b provided in the inter-layer insulation layer 26, and a via 21c coupling the electrically-conductive film 21a and the electrically-conductive film 21b to each other. In other words, the readout electrode 21A has a two-layer configuration including the electrically-conductive film 21a that is formed in the same layer as the accumulation electrode 21B and the electrically-conductive film 21b provided in a layer different from the electrically-conductive film 21a (in the inter-layer insulation layer 26). In the present embodiment, the electrically-conductive film 21b is disposed to extend toward below the accumulation electrode 21B and be opposed to the accumulation electrode 21B with the inter-layer insulation layer 26 interposed therebetween. Namely, a portion where the electrically-conductive film 21b and the accumulation electrode 21B are opposed to each other serves as the overlap section 21X. Providing the overlap section 21X causes elimination of a potential barrier between the readout electrode 21A and the accumulation electrode 21B, and improves transfer efficiency of charges accumulated on the accumulation electrode 21B to the readout electrode 21A.

It is to be noted that the overlap section 21X may have a configuration in which the accumulation electrode 21B extends towards below the readout electrode 21A. However, as illustrated in FIGS. 1 and 2, in a case where the readout electrode 21A extends toward below accumulation electrode 21B, it is less likely to cause a difference in potential gradient, and it is possible to more reliably transfer charges in the photoelectric conversion layer 22 to the readout electrode 21A. Accordingly, the overlap section 21X is preferably formed through extending the readout electrode 21A toward below the accumulation electrode 21B.

The lower electrode 21 includes an electrically-conductive film having optical transparency, and includes, for example, ITO (indium tin oxide). However, as a constituent material of the lower electrode 21, in addition to ITO, a tin oxide ($SnO_2$)-based material to which a dopant is added or a zinc oxide-based material prepared through adding a dopant to aluminum zinc oxide (ZnO) may be used. Examples of the zinc oxide-based material include aluminum zinc oxide (AZO) to which aluminum (Al) is added as a dopant, gallium (Ga)-added gallium zinc oxide (GZO), and indium (In)-added indium zinc oxide (IZO). In addition to these materials, CuI, $InSbO_4$, ZnMgO, $CuInO_2$, $MgIN_2O_4$, CdO, $ZnSnO_3$, etc. may also be used.

The photoelectric conversion layer 22 converts optical energy into electric energy. The photoelectric conversion layer 22 includes two or more kinds of organic semiconductor materials (p-type semiconductor materials or n-type semiconductor materials) that each function as a p-type semiconductor or an n-type semiconductor. The photoelectric conversion layer 22 has a junction surface (a p/n junction surface) between the p-type semiconductor material and the n-type semiconductor material in the layer. The p-type semiconductor relatively functions as an electron donor (a donor) and the n-type semiconductor relatively functions as an electron acceptor (an acceptor). The photoelectric conversion layer 22 provides a field where excitons generated upon absorption of light are dissociated into electrons and holes. Specifically, the excitons are dissociated into the electrons and the holes at an interface (the p/n junction surface) between the electron donor and the electron acceptor.

The photoelectric conversion layer 22 may include, in addition to the p-type semiconductor material and the n-type semiconductor material, an organic semiconductor material, i.e., a so-called dye material, that photoelectrically converts light in a predetermined wavelength range and allows light in another wavelength range to pass therethrough. In a case where the photoelectric conversion layer 22 is formed with use of three kinds of organic semiconductor materials including the p-type semiconductor material, the n-type semiconductor material, and the dye material, the p-type semiconductor material and the n-type semiconductor material each preferably include a material having optical transparency in a visible range (for example, from 450 nm to 800 nm). The photoelectric conversion layer 22 has a thickness in a range from 50 nm to 500 nm, for example.

Examples of the organic semiconductor material included in the photoelectric conversion layer 22 include quinacridone, chlorinated boron subphthalocyanine, pentacene, benzothienobenzothiophene, fullerene, and derivatives thereof. The photoelectric conversion layer 22 includes a combination of two or more kinds of the organic semiconductor materials described above. The combination of the organic semiconductor materials described above serve as a p-type semiconductor or an n-type semiconductors depending on the combination.

It is to be noted that the organic semiconductor materials included in the photoelectric conversion layer 22 are not specifically limited. In addition to the organic semiconductor materials described above, for example, one kind of naphthalene, anthracene, phenanthrene, tetracene, pyrene, perylene, fluoranthene, and derivatives thereof is preferably used. Alternatively, a polymer such as phenylenevinylene, fluorene, carbazole, indole, pyrene, pyrrole, picoline, thiophene, acetylene, diacetylene or a derivative thereof may be used. Additionally, it is possible to preferably use a metal complex dye, a cyanine-based dye, a merocyanine-based dye, a phenylxanthene-based dye, a triphenylmethane-based dye, a rhodacyanine-based dye, a xanthene-based dye, a macrocyclic azaannulene-based dye, an azulene-based dye, naphthaquinone, an anthraquinone-based dye, a chain compound in which a condensed polycyclic aromatic group such as anthracene and pyrene and an aromatic ring or a heterocyclic compound are condensed, a cyanine-like dye bonded by two nitrogen-containing hetero rings such as quinoline, benzothiazole, and benzoxazole that have a squarylium group and croconic methine group as a bonded chain, or by a squarylium group or a croconic methine group, etc. It is to be noted that as the foregoing metal complex dye, a dithiol metal complex-based dye, a metallophthalocyanine dye, a metalloporphyrine dye, or a ruthenium complex dye is preferable, but the metal complex dye is not limited thereto.

Other layers may be provided between the photoelectric conversion layer 22 and the lower electrode 21 (specifically between the photoelectric conversion layer 22 and the insulation layer 27) and between the photoelectric conversion layer 22 and the upper electrode 23. Specifically, for example, an undercoat film, a hole transport layer, an electron blocking film, the photoelectric conversion layer 22, a hole blocking film, a buffer film, an electron transport layer, a work function adjustment film, etc. may be stacked in order from a side on which the lower electrode 21 is located.

The upper electrode 23 includes an electrically-conductive film having optical transparency similar to the lower electrode 21. In the solid-state imaging apparatus 1 using the solid-state imaging element 10A as one pixel, the upper electrode 23 may be separated for each of pixels or formed as a common electrode for the respective pixels. The upper electrode 23 has a thickness in a range from 10 nm to 200 nm, for example.

The fixed charge layer 24 may include a film having positive fixed charges or negative fixed charges. Materials of the film having negative fixed charges include hafnium oxide, aluminum oxide, zirconium oxide, tantalum oxide, titanium oxide, etc. Moreover, in addition to the materials described above, lanthanum oxide, praseodymium oxide, cerium oxide, neodymium oxide, promethium oxide, samarium oxide, europium oxide, gadolinium oxide, terbium oxide, dysprosium oxide, holmium oxide, thulium oxide, ytterbium oxide, lutetium oxide, yttrium oxide, an aluminum nitride film, a hafnium oxynitride film, an aluminum oxynitride film, etc. may also be used.

The fixed charge layer 24 may have a configuration in which two or more kinds of films are stacked. This makes it possible to further enhance a function as a hole accumulation layer in a case of a film having negative fixed charges, for example.

Although a material of the dielectric layer 25 is not specifically limited, the dielectric layer 25 is formed using, for example, a silicon oxide film, TEOS, a silicon nitride film, a silicon oxynitride film, etc.

The inter-layer insulation layer 26 includes, for example, a single-layer film including one kind of silicon oxide, silicon nitride, silicon oxynitride (SiON), etc., or a laminated film including two or more kinds thereof.

The insulation layer 27 electrically separates the accumulation electrode 21B and the photoelectric conversion layer 22 from each other. The insulation layer 27 is provided on the inter-layer insulation layer 26, for example, to cover the lower electrode 21. Moreover, the insulation layer 27 has an opening 27H above the readout electrode 21A of the lower electrode 21, and the readout electrode 21A and the photoelectric conversion layer 22 are electrically coupled to each other through the opening 27H. It is possible to form the insulation layer 27 with use of a material similar to that of the inter-layer insulation layer 26, for example, and the insulation layer 27 includes, for example, a single-layer film including one kind of silicon nitride, silicon oxynitride (SiON), etc., or a laminated film including two or more kinds thereof. The insulation layer 27 has a thickness in a range from 20 nm to 500 nm, for example, The protective layer 28 includes a material having optical transparency, and includes, for example, a single-layer film including any of silicon oxide, silicon nitride, silicon oxynitride, etc., or a laminated film including two or more kinds thereof. The protective layer 28 has a thickness in a range from 100 nm to 30000 nm, for example.

The semiconductor substrate 30 includes a n-type silicon (Si) substrate, for example, and has a p-well 31 in a predetermined region. The transfer transistors Tr2 and Tr3, the amplifier transistor AMP, the reset transistor RST, the select transistor SEL, etc. described above are provided on the second surface 30B of the p-well 31. Moreover, a peripheral circuit (not illustrated) including a logic circuit, etc. is provided in a periphery of the semiconductor substrate 30.

The reset transistor RST (the rest transistor Tr1rst) resets charges transferred from the organic photoelectric converter 20 to the floating diffusion FD1, and includes a MOS transistor, for example. Specifically, the reset transistor Tr1rst includes a reset gate Grst, a channel formation region 36A, and source-drain regions 36B and 36C. The reset gate Grst is coupled to a reset line RST1, and one source-drain region 36B of the reset transistor Tr1rst also serves as the floating diffusion FD1. The other source-drain region 36C included in the reset transistor Tr1rst is coupled to a power source VDD.

The amplifier transistor AMP is a modulation element that modulates an amount of charges generated in the organic photoelectric converter 20 into voltage, and includes a MOS transistor, for example. Specifically, the amplifier transistor AMP includes a gate Gamp, a channel formation region 35A, and source-drain regions 35B and 35C. The gate Gamp is coupled to the readout electrode 21A and the one source-drain region 36B (the floating diffusion FD1) of the reset transistor Tr1rst through the first lower contact 45, the coupling section 41A, the second lower contact 46, the through electrode 34, etc. Moreover, one source-drain region 35B shares a region with the other source-drain region 36C included in the reset transistor Tr1rst, and is coupled to the power source VDD.

The select transistor SEL (a select transistor TR1sel) includes a gate Gsel, a channel formation region 34A, and source-drain regions 34B and 34C. The gate Gsel is coupled to a selection line SEL1. Moreover, one source-drain region 34B shares a region with the other source-drain region 35C included in the amplifier transistor AMP, and the other source-drain region 34C is coupled to a signal line (a data output line) VSL1.

The inorganic photoelectric converters 32B and 32R each have a p/n junction in a predetermined region of the semiconductor substrate 30. The inorganic photoelectric converters 32B and 32R enable dispersion of light in a longitudinal direction with use of a difference in wavelength of absorbed light depending on a depth of light incidence in the silicon substrate. The inorganic photoelectric converter 32B selectively detects blue light to accumulate signal charges corresponding to blue, and is disposed at a depth that allows for efficient photoelectric conversion of blue light. The inorganic photoelectric converter 32R selectively detects red light to accumulate signal charges corresponding to red, and is disposed at a depth that allows for efficient photoelectric conversion of red light. It is to be noted that blue (B) and red (R) are colors respectively corresponding to a wavelength range from 450 nm to 495 nm, for example, and a wavelength range from 620 nm to 750 nm, for example. It is sufficient if each of the inorganic photoelectric converters 32B and 32R is allowed to detect light in a portion or the entirety of a corresponding one of the wavelength ranges.

The inorganic photoelectric converter 32B includes a p+ region serving as a hole accumulation layer, and an n region serving as an electron accumulation layer, for example. The inorganic photoelectric converter 32R has a p+ region serving as a hole accumulation layer, and an n region serving as an electron accumulation layer (has a stacking structure of p-n-p), for example. The n region of the inorganic photoelectric converter 32B is coupled to the vertical type transfer transistor Tr2. The p+ region of the inorganic photoelectric converter 32B bends along the transfer transistor Tr2 and is connected to the p+ region of the inorganic photoelectric converter 32R.

The transfer transistor Tr2 (a transfer transistor TR2trs) transfers, to the floating diffusion FD2, signal charges (herein, electrons) corresponding to blue generated and accumulated in the inorganic photoelectric converter 32B. The inorganic photoelectric converter 32B is formed at a position deep from the second surface 30B of the semiconductor substrate 30; therefore, the transfer transistor TR2trs of the inorganic photoelectric converter 32B preferably includes a vertical type transistor. Moreover, the transfer transistor TR2trs is coupled to a transfer gate line TG2. Further, the floating diffusion FD2 is provided in a region 37C in proximity to a gate Gtrs2 of the transfer transistor TR2trs. The charges accumulated in the inorganic photoelectric converter 32B are read by the floating diffusion FD2 through a transfer channel formed along the gate Gtrs2.

The transfer transistor Tr3 (a transfer transistor TR3trs) transfers, to the floating diffusion FD3, signal charges (herein, electrons) corresponding to red generated and accumulated in the inorganic photoelectric converter 32R, and includes, for example, a MOS transistor. Moreover, the transfer transistor TR3trs is coupled to a transfer gate line TG3. Further, the floating diffusion FD3 is provided in a region 38C in proximity to a gate Gtrs3 of the transfer transistor TR3trs. The charges accumulated in the inorganic photoelectric converter 32R are read by the floating diffusion FD3 through a transfer channel formed along the gate Gtrs3.

A reset transistor TR2rst, an amplifier transistor TR2amp, and a select transistor TR2sel that are included in a controller of the inorganic photoelectric converter 32B are further provided on the side on which the second surface 30B is located of the semiconductor substrate 30. Moreover, a reset transistor TR3rst, an amplifier transistor TR3amp, and a select transistor TR3sel that are included in a controller of the inorganic photoelectric converter 32R are further provided.

The reset transistor TR2rst includes a gate, a channel formation region, and source-drain regions. The gate of the reset transistor TR2rst is coupled to a reset line RST2, and one of the source-drain regions of the reset transistor TR2rst is coupled to the power source VDD. Another source-drain region of the reset transistor TR2rst also serves as the floating diffusion FD2.

The amplifier transistor TR2amp includes a gate, a channel formation region, and source-drain regions. The gate is coupled to the other source-drain region (the floating diffusion FD2) of the reset transistor TR2rst. Moreover, one source-drain region included in the amplifier transistor TR2amp shares a region with the one source-drain region included in the reset transistor TR2rst, and is coupled to the power source VDD.

The select transistor TR2sel includes a gate, a channel formation region, and source-drain regions. The gate is coupled to a selection line SEL2. Moreover, one of the source-drain regions included in the select transistor TR2sel shares a region with another source-drain region included in the amplifier transistor TR2amp. Another source-drain region included in the select transistor TR2sel is coupled to a signal line (a data output line) VSL2.

The reset transistor TR3rst includes a gate, a channel formation region, and source-drain regions. The gate of the reset transistor TR3rst is coupled to a reset line RST3, and one of the source-drain regions included in the reset transistor TR3rst is coupled to the power source VDD. Another source-drain region included in the reset transistor TR3rst also serves as the floating diffusion FD3.

The amplifier transistor TR3amp includes a gate, a channel formation region, and source-drain regions. The gate is coupled to the other source-drain region (the floating diffusion FD3) included in the reset transistor TR3rst. Moreover, one of the source-drain regions included in the amplifier transistor TR3amp shares a region with the one source-drain region included in the reset transistor TR3rst, and is coupled to the power source VDD.

The select transistor TR3sel includes a gate, a channel formation region, and source-drain regions. The gate is coupled to a selection line SEL3. Moreover, one of the source-drain regions included in the select transistor TR3sel shares a region with another source-drain region included in the amplifier transistor TR3amp. Another source-drain region included in the select transistor TR3sel is coupled to a signal line (a data output line) VSL3.

Each of the reset lines RST1, RST2, and RST3, the selection lines SEL1, SEL2, and SEL3, the transfer gate lines TG2 and TG3 is coupled to a vertical drive circuit 112 included in a drive circuit. The signal lines (data output lines) VSL1, VSL2, and VSL3 are coupled to a column signal processing circuit 113 included in the drive circuit.

The first lower contact 45, the second lower contact 46, the first upper contact 29A, and the second upper contact 29B each include, for example, a doped silicon material such as PDAS (Phosphorus Doped Amorphous Silicon) or a metal material such as aluminum (Al), tungsten (W), titanium (Ti), cobalt (Co), hafnium (Hf), and tantalum (Ta).

(1-2. Method of Manufacturing Solid-State Imaging Element)

It is possible to manufacture the solid-state imaging element 10A according to the present embodiment in the following manner, for example.

FIGS. 5 to 12 illustrate a method of manufacturing the solid-state imaging element 10A in process order. First, as illustrated in FIG. 5, the p-well 31, for example, is formed as a well of a first conductivity type in the semiconductor substrate 30, and the inorganic photoelectric converters 32B and 32R of a second conductivity type (the n type, for example) are formed inside the p-well 31. The p+ region is formed in proximity to the first surface 30A of the semiconductor substrate 30.

As also illustrated in FIG. 5, on the second surface 30B of the semiconductor substrate 30, n+ regions serving as the floating diffusions FD1 to FD3 are formed, and thereafter, a gate insulation layer 33 and a gate wiring layer 47 including respective gates of the transfer transistor Tr2, the transfer transistor Tr3, the select transistor SEL, the amplifier transistor AMP, and the reset transistor RST are formed. The transfer transistor Tr2, the transfer transistor Tr3, the select transistor SEL, the amplifier transistor AMP, and the reset transistor RST are thereby formed. Moreover, the multilayer wiring 40 including the first lower contact 45, the second lower contact 46, the wiring layers 41 to 43 including the coupling section 41A, and the insulation layer 44 is formed on the second surface 30B of the semiconductor substrate 30.

As a base substrate of the semiconductor substrate 30, an SOI (Silicon on Insulator) substrate in which the semiconductor substrate 30, an embedded oxide film (not illustrated), and a retaining substrate (not illustrated) are stacked is used. The embedded oxide film and the retaining substrate are not illustrated in FIG. 5, but are joined to the first surface 30A of the semiconductor substrate 30. Annealing treatment is performed after ion implantation.

Next, a supporting substrate (not illustrated), another semiconductor base substrate, or the like is joined to the side on which the second surface 30B is located of the semiconductor substrate 30 (a side on which the multilayer wiring 40 is located) and flipped from top to bottom. Subsequently, the semiconductor substrate 30 is separated from the embedded oxide film and the retaining substrate of the SOI substrate to cause the first surface 30A of the semiconductor substrate 30 to be exposed. It is possible to perform the above processes with technologies used in a typical CMOS process such as ion implantation and CVD (Chemical Vapor Deposition).

Next, as illustrated in FIG. 6, the semiconductor substrate 30 is processed from the side on which the first surface 30A is located by dry etching, for example, to form an annular opening 34H. A depth of the opening 34H penetrates from the first surface 30A to the second surface 30B of the semiconductor substrate 30 to reach the coupling section 41A, as illustrated in FIG. 6.

Subsequently, for example, the negative fixed charge layer 24 is formed on the first surface 30A of the semiconductor substrate 30 and a side surface of the opening 34H. Two or more kinds of films may be stacked as the negative fixed charge layer 24. This makes it possible to further enhance a function as the hole accumulation layer. After the negative fixed charge layer 24 is formed, the dielectric layer 25 is formed. Next, pad sections 39A and 39B are formed at predetermined positions on the dielectric layer 25, and thereafter, the insulation layer 26A is formed on the dielectric layer 25 and the pad sections 39A and 39B.

Subsequently, as illustrated in FIG. 7, an electrically-conductive film 21x is formed on the insulation layer 26A, and thereafter a photoresist PR is formed at a predetermined position of the electrically-conductive film 21x (for example, at a position between the pad section 39A and the pad section 39B). Thereafter, the electrically-conductive film 21b included in a readout electrode illustrated in FIG. 8 is patterned by etching and removal of the photoresist PR.

Subsequently, the insulation layer 26B is formed on the insulation layer 26A and the electrically-conductive film 21b, and thereafter a surface of the insulation layer 26B is planarized with use of a CMP (Chemical Mechanical Polishing) method, for example. Next, as illustrated in FIG. 9, openings 26H1, 26H2, and 26H3 are respectively formed on the electrically-conductive film 21b and the pad sections 39A and 39B, and thereafter, the opening 26H1, 26H2, and 26H3 are filled with an electrically-conductive material such as Al to form the via 21c, the first upper contact 29A, and the second upper contact 29B.

Subsequently, as illustrated in FIG. 10, an electrically-conductive film 21y is formed on the via 21c, the first upper contact 29A, the second upper contact 29B, and the inter-layer insulation layer 26, and thereafter, the photoresist PR is formed at a predetermined position of the electrically-conductive film 21y. Thereafter, the electrically-conductive film 21a included in the readout electrode 21A and the accumulation electrode 21B illustrated in FIG. 11 are patterned by etching and removal of the photoresist PR.

Next, as illustrated in FIG. 12, the insulation layer 27 is formed on the inter-layer insulation layer 26, the electrically-conductive film 21a, and the accumulation electrode 21B, and thereafter, the opening 27H is provided above the electrically-conductive film 21a. Thereafter, the photoelectric conversion layer 22, the upper electrode 23, the protective layer 28, and the light-shielding film 51 are formed on the inter-layer insulation layer 26. It is to be noted that as described above, in a case where any other organic layer (for example, an electron blocking layer, etc.) is formed above or below the photoelectric conversion layer 22, it is desirable to form the organic layer continuously in a vacuum process (in-situ vacuum process). In addition, the method of forming the photoelectric conversion layer 22 is not necessarily limited to a technique using a vacuum deposition method, and, other techniques, for example, a spin coat technology, a printing technology, etc. may also be used. Lastly, the optical member such as the planarization layer and the on-chip lens 52 are disposed. Thus, the solid-state imaging element 10A illustrated in FIG. 1 is completed.

In the solid-state imaging element 10A, light enters the organic photoelectric converter 20 through the on-chip lens 52, and thereafter the light passes through the organic photoelectric converter 20 and the inorganic photoelectric converters 32B and 32R in order. Each of green light, blue light, and red light is photoelectrically converted in the course of passing. In the following, signal acquisition operations of the respective colors are described.

(Acquisition of Green Signal by Organic Photoelectric Converter 20) Of light having entered the solid-state imaging element 10A, first, green light is selectively detected (absorbed) and photoelectrically converted in the organic photoelectric converter 20.

The organic photoelectric converter 20 is coupled to the gate Gamp of the amplifier transistor AMP and the floating diffusion FD1 through the through electrode 34. Thus, electrons of the electron-hole pairs generated in the organic photoelectric converter 20 are retrieved from the side on which the lower electrode 21 is located, transferred to the side on which the second surface 30B is located of the semiconductor substrate 30 through the through electrode 34, and accumulated in the floating diffusion FD1.

Simultaneously with this, the amount of charges generated in the organic photoelectric converter 20 is modulated into voltage by the amplifier transistor AMP.

In addition, the reset gate Grst of the reset transistor RST is disposed adjacent to the floating diffusion FD1. Accordingly, the charges accumulated in the floating diffusion FD1 are reset by the reset transistor RST.

Herein, the organic photoelectric converter 20 is coupled not only to the amplifier transistor AMP but also to the floating diffusion FD1 through the through electrode 34, thus making it possible for the reset transistor RST to easily reset the charges accumulated in the floating diffusion FD1.

In contrast to this, in a case where the through electrode 34 is not coupled to the floating diffusion FD1, it is difficult to reset the charges accumulated in the floating diffusion FD1, causing the charges to be drawn to a side on which the upper electrode 23 is located by application of a large voltage. This may damage the photoelectric conversion layer 22. In addition, a configuration that enables resetting in a short period of time causes an increase in dark time noise, thereby resulting in a trade-off; therefore, this configuration is difficult.

FIG. 13 illustrates an operation example of the solid-state imaging element 10A. (A) indicates a potential in the accumulation electrode 21B; (B) indicates a potential in the floating diffusion FD1 (the readout electrode 21A); and (C) indicates a potential in the gate (Gsel) of the reset transistor TR1rst. In the solid-state imaging element 10A, a voltage is individually applied to each of the readout electrode 21A and the accumulation electrode 21B.

In the solid-state imaging element 10A, in an accumulation period, the drive circuit applies a potential V1 to the readout electrode 21A, and applies a potential V2 to the accumulation electrode 21B. Herein, the potentials V1 and V2 have a relationship of V2>V1. Accordingly, charges (herein, electrons) generated by photoelectric conversion are drawn to the accumulation electrode 21B, and accumulated in a region of the photoelectric conversion layer 22 opposed to the accumulation electrode 21B (the accumulation period). In this regard, a value of a potential in the region of the photoelectric conversion layer 22 opposed to the accumulation electrode 21B becomes more negative with the passage of time of photoelectric conversion. It is to be noted that holes are sent from the upper electrode 23 to the drive circuit.

In the solid-state imaging element 10A, a reset operation is performed in a late period of the accumulation period. Specifically, at a timing t1, a scanner turns a voltage of the reset signal RST from a low level to a high level. This causes the reset transistor TR1rst in the unit pixel P to be turned on, and as a result, a voltage of the floating diffusion FD1 is set to a power source voltage VDD, and the voltage of the floating diffusion FD1 is reset (a reset period).

After completion of the reset operation, readout of charges is performed. Specifically, at a timing t2, the drive circuit applies a potential V3 to the readout electrode 21A, and applies a potential V4 to the accumulation electrode 21B. Herein, the potentials V3 and V4 have a relationship of V3<V4. Accordingly, charges (herein, electrons) accumulated in a region corresponding to the accumulation electrode 21B are read from the readout electrode 21A to the floating diffusion FD1. In other words, the charges accumulated in the photoelectric conversion layer 22 is read by a controller (a transfer period).

After completion of such a readout operation, the drive circuit applies the potential V1 to the readout electrode 21A again, and applies the potential V2 to the accumulation electrode 21B again. Accordingly, charges (herein, electrons) generated by photoelectric conversion are drawn to the accumulation electrode 21B, and accumulated in the region of the photoelectric conversion layer 22 opposed to the accumulation electrode 21B (the accumulation period).

(Acquisition of Blue Signal and Red Signal by Inorganic Photoelectric Converters 32B and 32R) Subsequently, blue light and red light of the light having passed through the organic photoelectric converter 20 are absorbed and photoelectrically converted in order respectively in the inorganic photoelectric converter 32B and the inorganic photoelectric converter 32R. In the inorganic photoelectric converter 32B, electrons corresponding to the incident blue light are accumulated in the n region of the inorganic photoelectric converter 32B, and the accumulated electrons are transferred to the floating diffusion FD2 by the transfer transistor Tr2. Similarly, in the inorganic photoelectric converter 32R, electrons corresponding to the incident red light are accumulated in the n region of the inorganic photoelectric converter 32R, and the accumulated electrons are transferred to the floating diffusion FD3 by the transfer transistor Tr3.

(1-3. Workings and Effects)

In a solid-state imaging apparatus that separately extracts signals of B/G/R from one pixel as described above, charges generated in a semiconductor substrate are temporarily accumulated in each of photoelectric converters formed in the semiconductor substrate, and thereafter are each transferred to a corresponding one of floating diffusion layers (floating diffusions FD). This makes it possible to completely deplete each of the photoelectric converters. In contrast, charges photoelectrically converted by an organic photoelectric conversion film are directly accumulated in the floatind diffusion layer provided in the semiconductor substrate through a vertical transfer path provided in the semiconductor substrate. Accordingly, it is difficult to completely deplete the organic photoelectric conversion film, and as a result, reset noise is increased and random noise is deteriorated, thereby resulting in degradation in imaging image quality.

As a solid-state imaging element that solves this issue, a solid-state imaging element has been contrived in which one electrode (for example, a lower electrode) of electrodes interposing an organic photoelectric conversion film therebetween is divided into, for example, two electrodes (a charge readout electrode and a charge accumulation electrode), each of which is allowed to independently apply a voltage, and the charge readout electrode is coupled to the floating diffusion layer. In this solid-state imaging element, charges generated in the organic photoelectric conversion film are accumulated in a region inside the organic photoelectric conversion film opposed to the charge accumulation electrode. The accumulated charges are transferred to the charge readout electrode and read by the charge readout electrode as appropriate, which makes it possible to completely deplete a charge accumulation section at start of exposure, thereby suppressing reset noise and improving imaging image quality.

However, in a case where the lower electrode is simply divided into the charge readout electrode and the charge accumulation electrode, there is a possibility that imaging characteristics, specifically afterimage characteristics are deteriorated. This is caused by delay in transfer of the charges accumulated on the charge accumulation electrode and charges remaining on the charge accumulation electrode, and is caused by formation of a gap, i.e., a potential barrier where a voltage is not applied between the charge readout electrode and the charge accumulation electrode. The charge readout electrode and the charge accumulation electrode are dividedly formed, for example, through performing lithography and etching processing on a single electrode material film; therefore, it is difficult to narrow a gap width between the electrode in terms of processing.

In contrast, in the present embodiment, the lower electrode 21 is divided into the readout electrode 21A and the accumulation electrode 21B, and the overlap section 21X where the readout electrode 21A and the accumulation electrode 21B overlap each other is formed between these adjacent electrodes. Specifically, the readout electrode 21A includes the electrically-conductive film 21a that is formed in the same layer as the accumulation electrode 21B, and the electrically-conductive film 21b that is formed below the electrically-conductive film 21a and the accumulation electrode 21B, specifically in the inter-layer insulation layer 26, and is electrically coupled to the electrically-conductive film 21a through the via 21c and extends toward below the accumulation electrode 21B. Accordingly, a region where the accumulation electrode 21B and the electrically-conductive film 21b are opposed to each other, i.e., the overlap section 21X is formed, and a region (gap) where a voltage is not applied between the readout electrode 21A and the accumulation electrode 21B is eliminated. This makes it possible to eliminate the potential barrier between the electrodes and improve transfer efficiency of charges accumulated on the accumulation electrode 21B.

As described above, in the present embodiment, the lower electrode 21 is divided into the readout electrode 21A and the accumulation electrode 21B, and the overlap section 21X where the readout electrode 21A and the accumulation electrode 21B overlap each other is formed between these adjacent electrodes. This makes it possible to improve transfer efficiency of charges accumulated on the accumulation electrode 21B and improve imaging characteristics.

Next, description is given of second to fifth embodiments and a modification example. In the following, components similar to those in the foregoing first embodiment are denoted by same reference numerals, and description thereof is omitted where appropriate.

2. SECOND EMBODIMENT

FIG. 14 schematically illustrates a cross-sectional configuration of a main part of a solid-state imaging element (a solid-state imaging element 10B) according to the second embodiment of the present disclosure. As with the foregoing first embodiment, the solid-state imaging element 10B is of a so-called longitudinal direction spectral type in which, for example, one organic photoelectric converter 60 and two inorganic photoelectric converters 32B and 32R are stacked in the longitudinal direction. The solid-state imaging element 10B according to the present embodiment differs from the foregoing first embodiment in that a lower electrode 61 included in the organic photoelectric converter 60 includes three electrodes including a readout electrode 61A, an accumulation electrode 61B, and a transfer electrode 61C.

The transfer electrode 61C improves efficiency of transfer of charges accumulated on the accumulation electrode 61B to the readout electrode 61A, and is provided between the readout electrode 61A and the accumulation electrode 61B. The transfer electrode 61C is coupled to a pixel drive circuit included in the drive circuit through a third upper contact 29C and a pad section 39C, for example. Each of the readout electrode 61A, the accumulation electrode 61B, and the transfer electrode 61C is allowed to independently apply a voltage.

In the present embodiment, the transfer electrode 61C includes an electrically-conductive film 61a that is formed in the same layer as the readout electrode 61A and the accumulation electrode 61B, and electrically-conductive films 61b and 61d that are formed below the readout electrode 61A, the accumulation electrode 61B, etc., specifically in the inter-layer insulation layer 26, and are electrically coupled to the electrically-conductive film 61a through vias 61c and 61e. The electrically-conductive films 61b and 61d respectively extend toward below the readout electrode 61A and the accumulation electrode 61B to form an overlap section 61X and an overlap section 61Y.

In the solid-state imaging element 10B according to the present embodiment, in the transfer period after completion of the reset operation, the drive circuit applies a potential V5, a potential V6, and a potential V7 (V5>V6>V7) respectively to the readout electrode 61A, the accumulation electrode 61B, and the transfer electrode 61C. Accordingly, charges accumulated in a region corresponding to the accumulation electrode 61B move from on the accumulation electrode 61B onto the transfer electrode 61C and the readout electrode 61A in order to be read to the floating diffusion FD1.

As described above, in the present embodiment, the transfer electrode 61C is provided between the readout electrode 61A and the accumulation electrode 61B, and the overlap sections 61X and 61Y are respectively provided between the transfer electrode 61C and the readout electrode 61A and between the transfer electrode 61C and the accumulation electrode 61B. This makes it possible to more reliably move charges from the readout electrode 61A to the floating diffusion FD1, thereby further improving transfer efficiency of charges accumulated on the accumulation electrode 61B. This makes it possible to further improve after-image characteristics.

It is to be noted that in the present embodiment in which the transfer electrode 61C is provided between the readout electrode 61A and the accumulation electrode 61B, in a case where the light-shielding film 51 is provided in the protective layer 28 as illustrated in FIG. 1, the light-shielding film 51 is preferably formed to cover only the readout electrode 61A. In a case where the light-shielding film 51 is formed to also cover the transfer electrode 61C, a photoelectric conversion region in the photoelectric conversion layer 62 is decreased, which may cause a decline in photovoltaic power.

3. THIRD EMBODIMENT

FIG. 15 schematically illustrates a cross-sectional configuration of a main part of a solid-state imaging element (a solid-state imaging element 10C) according to the third embodiment of the present disclosure. As with the foregoing first and second embodiments, the solid-state imaging element 10C is of a so-called longitudinal direction spectral type in which, for example, one organic photoelectric converter 70 and two inorganic photoelectric converters 32B and 32R are stacked in the longitudinal direction. The solid-state imaging element 10C according to the present embodiment differs from the foregoing second embodiment in that a lower electrode 71 included in the organic photoelectric converter 70 includes four electrodes including one readout electrode 71A, two accumulation electrodes 71B1 and 71B2, and one transfer electrode 71C.

In the present embodiment, as described above, the accumulation electrode 71B is divided into two electrodes (the accumulation electrodes 71B1 and 71B2), which are respectively coupled to the pixel drive circuit included in the drive circuit through the second upper contact 29B1 and the pad section 39B1 and through the second upper contact 29B2 and the pad section 39B2. The accumulation electrode 71B1 located on a downstream side of a charge transfer path of the accumulation electrodes 71B1 and 71B2 has a two-layer configuration as with the readout electrode 21A and the transfer electrode 51C described above. In other words, the accumulation electrode 71B1 includes an electrically-conductive film 71f that is formed in the same layer as the readout electrode 71A and the accumulation electrode 71B2, and an electrically-conductive film 71g that is formed below the electrically-conductive film 71f, specifically in the inter-layer insulation layer 26, and is electrically coupled to the electrically-conductive film 71f through a via 71h. The electrically-conductive film 71g extends toward below the accumulation electrode 71B2 to form an overlap section 71Z.

It is to be noted that as with the foregoing second embodiment, the transfer electrode 71C according to the present embodiment includes an electrically-conductive film 71a that is formed in the same layer as the readout electrode 71A and the accumulation electrode 71B, and electrically-conductive films 71b and 71d that are formed below the readout electrode 71A, the accumulation electrode 71B, etc., specifically in the inter-layer insulation layer 26, and are electrically coupled to the electrically-conductive film 71a through vias 71c and 71e. The electrically-conductive films 71b and 71d respectively extend toward below the readout electrode 71A and the accumulation electrode 71B to form an overlap section 71X and an overlap section 71Y.

As described above, in the present embodiment, the accumulation electrode 71B is configured through dividedly forming two accumulation electrodes 71B1 and 71B2, and the overlap sections 71X, 71Y, and 71Z are respectively provided between the readout electrode 71A and the transfer electrode 71C, between the transfer electrode 71C and the accumulation electrode 71B1, and between the accumulation electrode 71B1 and the accumulation electrode 71B2. Dividing the accumulation electrode 71B into two electrodes in such a manner makes it possible to reduce variations in transfer time of charges to be transferred from the accumulation electrode 71B to the readout electrode 71A. This makes it possible to further improve afterimage characteristics.

It is to be noted that in the present embodiment, an example in which the accumulation electrode 71B is divided into two electrodes is described; however, the accumulation electrodes 71B may be divided into three electrodes, or four or more electrodes. In this case, an accumulation electrode located closer to the downstream side of the charge transfer path has a two-layer configuration, and an electrically-conductive film located on a lower side preferably extends toward below an accumulation electrode located closer to an upstream side to form an overlap section.

4. FOURTH EMBODIMENT

FIG. 16 schematically illustrates a cross-sectional configuration of a main part of a solid-state imaging element (a solid-state imaging element 10D) according to the fourth embodiment of the present disclosure. As with the foregoing first to third embodiments, the solid-state imaging element 10D is of a so-called longitudinal direction spectral type in which, for example, one organic photoelectric converter 80 and two inorganic photoelectric converters 32B and 32R are stacked in the longitudinal direction. The solid-state imaging element 10D according to the present embodiment differs from the foregoing second embodiment in that a lower electrode 81 included in the organic photoelectric converter 80 includes four electrodes including a readout electrode 81A, an accumulation electrode 81B, a transfer electrode 81C, and discharging electrode 81D.

The discharging electrode 81D sends, to the drive circuit, charges that are not sufficiently drawn by the accumulation electrode 81B, or charges remaining in a case where an amount of charges equal to or exceeding transfer capability are generated (a so-called overflowing charges). The discharging electrode 81D is disposed around the accumulation electrode 81B (that is, in a frame-like shape). The discharging electrode 81D is coupled to the pixel drive circuit included in the drive circuit through a fourth upper contact 39D and a pad section 39D, for example. Each of the readout electrode 81A, the accumulation electrode 61B, and the discharging electrode 81D is allowed to independently apply a voltage.

The discharging electrode 81D according to the present embodiment includes an electrically-conductive film 81f that is formed in the same layer as the readout electrode 81A and the accumulation electrode 81B, and an electrically-conductive film 81g that is formed below the electrically-conductive film 81f, specifically in the inter-layer insulation layer 26, and is electrically coupled to the electrically-conductive film 81f through a via 81h. The electrically-conductive film 81g extends toward below the accumulation electrode 81B to form an overlap section 81Z.

It is to be noted that as with the foregoing second and third embodiments, the transfer electrode 81C according to the present embodiment has a two-layer configuration, that is, includes an electrically-conductive film 81a that is formed in the same layer as the readout electrode 81A and the accumulation electrode 81B, and electrically-conductive film 81b and 81d that are formed below the readout electrode 81A, the accumulation electrode 81B, etc., specifically in the inter-layer insulation layer 26, and are electrically coupled to the electrically-conductive film 81a through vias 81c and 81e. The electrically-conductive films 81b and 81d respectively extend toward below the readout electrode 81A and the accumulation electrode 81B to form an overlap section 81X and an overlap section 81Y.

As described above, in the present embodiment, the discharging electrode 81D is formed at a position adjacent to the accumulation electrode 81B, and the overlap section 81Z is provided between the accumulation electrode 81B and the discharging electrode 81D. This makes it possible to discharge all redundant charges generated in the photoelectric conversion layer 82 onto the accumulation electrode 81B. Accordingly, it is possible to further improve afterimage characteristics.

It is to be noted that the discharging electrode 81D is not necessarily provided for each solid-state imaging element, and as with the solid-state imaging apparatus 1 to be described later, in a case where a plurality of solid-state imaging elements are used, for example, the discharging electrode 81D may be shared between adjacent pixels.

5. FIFTH EMBODIMENT

FIG. 17 schematically illustrates a cross-sectional configuration of a main part of a solid-state imaging element (a solid-state imaging element 10E) according to the fifth embodiment of the present disclosure. As with the foregoing first embodiment, the solid-state imaging element 10E is of a so-called longitudinal direction spectral type in which, for example, one organic photoelectric converter 90 and two inorganic photoelectric converters 32B and 32R are stacked in the longitudinal direction. The solid-state imaging element 10E according to the present embodiment differs from the foregoing first to fourth embodiments in that an upper electrode 93 disposed on the light entering side S1 with respect to a photoelectric conversion layer 92 includes a readout electrode 93A and an accumulation electrode 93B.

In the solid-state imaging element 10E according to the present embodiment, the organic photoelectric converter 90 has a configuration in which a lower electrode 91 (the second electrode), the photoelectric conversion layer 92, and the upper electrode 93 (the first electrode) including the readout electrode 93A and the accumulation electrode 93B are stacked in this order. An insulation layer 94 is provided between the photoelectric conversion layer 92 and the upper electrode 93, and the photoelectric conversion layer 92 and the readout electrode 93A are electrically coupled to each other through an opening 94H provided in the insulation layer 94.

In the present embodiment, the readout electrode 93A has a two-layer configuration. Specifically, the readout electrode 93A includes an electrically-conductive film 93a that is formed in the same layer as the accumulation electrode 93B, and an electrically-conductive film 93b that is formed above the electrically-conductive film 93a, specifically in the protective layer 28, and is electrically coupled to the electrically-conductive film 93a through a via 93c. The electrically-conductive film 93b extends toward above the accumulation electrode 93B with the protective layer 28 interposed therebetween to form an overlap section 93X.

As described above, in the present embodiment, the upper electrode 93 includes the readout electrode 93A and the accumulation electrode 93B, and the overlap section 93X is provided between the readout electrode 93A and the accumulation electrode 93B. This makes it possible to further improve transfer efficiency of charges accumulated in a region opposed to the accumulation electrode 93B and improve afterimage characteristics, as with the foregoing first embodiment.

6. MODIFICATION EXAMPLE

The solid-state imaging elements 10A to 10E of the present disclosure may further have the following configuration.

FIG. 18 schematically illustrates a cross-sectional configuration of a main part of a solid-state imaging element 10F on the basis of the solid-state imaging element 10A according to the first embodiment. As with the foregoing first embodiment, the solid-state imaging element 10F is of a so-called longitudinal direction spectral type in which, for example, one organic photoelectric converter 20 and two inorganic photoelectric converters 32B and 32R are stacked in the longitudinal direction. The solid-state imaging element 10F according to the present modification example differs from the foregoing first embodiment in that a semiconductor layer 101 is provided below the photoelectric conversion layer 22.

The semiconductor layer 101 is provided below the photoelectric conversion layer 22, specifically, between the insulation layer 27 and the photoelectric conversion layer 22. The semiconductor layer 101 is preferably configured with use of a material having higher charge mobility than that of the photoelectric conversion layer 22 and having a large band gap. Examples of such a material include a compound semiconductor material such as IGZO, transition metal dichalcogenide, silicon carbide, diamond, graphene, carbon nanotubes, a condensed polycyclic hydrocarbon compound, a condensed heterocyclic compound, etc. Providing the semiconductor layer 101 including any of the materials described above below the photoelectric conversion layer 22 makes it possible to prevent recombination of charges during charge accumulation, which makes it possible to improve transfer efficiency.

It is to be noted that providing the semiconductor layer 101 causes the solid-state imaging element 10F in the present modification example to have a configuration in which the readout electrode 21A and the photoelectric conversion layer 22 are stacked with the semiconductor layer 101 interposed therebetween. Moreover, the semiconductor layer 101 is provided for each unit pixel P, as with the components of the organic photoelectric converter 20 illustrated in FIG. 1.

Further, in the present modification example, description has been given with reference to FIG. 18 on the basis of the solid-state imaging element 10A according to the first embodiment as an example; however, the semiconductor layer 101 according to the present modification example is applicable to any of the solid-state imaging elements 10B to 10E according to the foregoing second to fifth embodiments, and effects similar to those in the present modification example are achieved. It is to be noted that the semiconductor layer 101 in the present modification example is formed between the photoelectric conversion layer and an electrode that reads signal charges. Accordingly, in a case where the semiconductor layer 101 is applied to the fifth embodiment, the semiconductor layer 101 is formed between the photoelectric conversion layer 92 and the insulation layer 94.

7. APPLICATION EXAMPLES

Application Example 1

FIG. 19 illustrates an overall configuration of a solid-state imaging apparatus (the solid-state imaging apparatus 1) that uses, for each of the pixels, the solid-state imaging element 10A (or the solid-state imaging element 10B, 10C, 10D, or 10E) described in the foregoing first embodiment (or any of the second to fifth embodiments and the modification example). The solid-state imaging apparatus 1 is a CMOS image sensor, and includes a pixel unit 1a as an imaging region on the semiconductor substrate 30 and includes, in a peripheral region of the pixel unit 1a, a peripheral circuit unit 130 that includes, for example, a row scanner 131, a horizontal selector 133, a column scanner 134, and a system controller 132.

The pixel unit 1a includes a plurality of unit pixels P (each corresponding to the solid-state imaging element 10A) two-dimensionally arranged in a matrix, for example. The unit pixels P are wired with pixel drive lines Lread (specifically, row selection lines and reset control lines) for respective pixel rows and vertical signal lines Lsig for respective pixel columns. The pixel drive lines Lread transmit drive signals for signal reading from the pixels. The pixel drive lines each have one end coupled to a corresponding one of output terminals, corresponding to the respective rows, of the row scanner 131.

The row scanner 131 includes a shift register, an address decoder, etc. and serves as a pixel driver, for example, that drives the respective unit pixels P in the pixel unit 1a on a row-by-row basis. A signal outputted from each of the unit pixels P of a pixel row selectively scanned by the row scanner 131 is supplied to the horizontal selector 133 through each of the vertical signal lines Lsig. The horizontal selector 133 includes an amplifier, a horizontal selection switch, etc. provided for each of the vertical signal lines Lsig.

The column scanner 134 includes a shift register, an address decoder, etc., and drives respective horizontal selection switches of the horizontal selector 133 in sequence while scanning the horizontal selection switches. Such selective scanning by the column scanner 134 causes the signals of the respective pixels transmitted through the respective vertical signal lines Lsig to be outputted in sequence to a horizontal signal line 135 and thereafter transmitted to outside of the semiconductor substrate 30 through the horizontal signal line 135.

Circuit components including the row scanner 131, the horizontal selector 133, the column scanner 134, and the horizontal signal line 135 may be formed directly on the semiconductor substrate 30 or disposed in an external control IC. Alternatively, these circuit components may be formed on any other substrate coupled by a cable, etc.

The system controller 132 receives a clock given from outside of the semiconductor substrate 30 or data etc. on instructions of operation modes, and also outputs data such as internal information of the solid-state imaging apparatus 1. The system controller 132 further includes a timing generator that generates various timing signals, and performs drive control of the peripheral circuits such as the row scanner 131, the horizontal selector 133, and the column scanner 134, on the basis of the various timing signals generated by the timing generator.

Application Example 2

The foregoing solid-state imaging apparatus 1 is applicable to various kinds of electronic apparatuses having imaging functions. Examples of the electronic apparatuses include camera systems such as a digital still camera and a video camera and a mobile phone having imaging functions. FIG. 20 illustrates, for purpose of an example, a schematic configuration of an electronic apparatus 2 (a camera). The electronic apparatus 2 is a video camera that enables shooting of a still image or a moving image, for example, and includes the solid-state imaging apparatus 1, an optical system (an optical lens) 310, a shutter apparatus 311, a driver 313 that drives the solid-state imaging apparatus 1 and the shutter apparatus 311, and a signal processor 312.

The optical system 310 guides image light (incident light) from an object to the pixel unit 1a of the solid-state imaging apparatus 1. The optical system 310 may include a plurality of optical lenses. The shutter apparatus 311 controls a period in which the solid-state imaging apparatus 1 is irradiated with the light and a period in which the light is blocked. The driver 313 controls a transfer operation of the solid-state imaging apparatus 1 and a shutter operation of the shutter apparatus 311. The signal processor 312 performs various types of signal processing on signals outputted from the solid-state imaging apparatus 1. An image signal Dout having been subjected to the signal processing is stored in a storage medium such as a memory or outputted to a monitor, etc.

Furthermore, the foregoing solid-state imaging apparatus 1 is applicable to the following electronic apparatuses (a capsule endoscope 10100, a mobile body of a vehicle, etc.).

Application Example 3

<Practical Application Example to In-vivo Information Acquisition System>

FIG. 21 is a block diagram depicting an example of a schematic configuration of an in-vivo information acquisition system of a patient using a capsule type endoscope, to which the technology according to an embodiment of the present disclosure (present technology) can be applied.

The in-vivo information acquisition system 10001 includes a capsule type endoscope 10100 and an external controlling apparatus 10200.

The capsule type endoscope 10100 is swallowed by a patient at the time of inspection. The capsule type endoscope 10100 has an image pickup function and a wireless communication function and successively picks up an image of the inside of an organ such as the stomach or an intestine (hereinafter referred to as in-vivo image) at predetermined intervals while it moves inside of the organ by peristaltic motion for a period of time until it is naturally discharged from the patient. Then, the capsule type endoscope 10100 successively transmits information of the in-vivo image to the external controlling apparatus 10200 outside the body by wireless transmission.

The external controlling apparatus 10200 integrally controls operation of the in-vivo information acquisition system 10001. Further, the external controlling apparatus 10200 receives information of an in-vivo image transmitted thereto from the capsule type endoscope 10100 and generates image data for displaying the in-vivo image on a display apparatus (not depicted) on the basis of the received information of the in-vivo image.

In the in-vivo information acquisition system 10001, an in-vivo image imaged a state of the inside of the body of a patient can be acquired at any time in this manner for a period of time until the capsule type endoscope 10100 is discharged after it is swallowed.

A configuration and functions of the capsule type endoscope 10100 and the external controlling apparatus 10200 are described in more detail below.

The capsule type endoscope 10100 includes a housing 10101 of the capsule type, in which a light source unit 10111, an image pickup unit 10112, an image processing unit 10113, a wireless communication unit 10114, a power feeding unit 10115, a power supply unit 10116 and a control unit 10117 are accommodated.

The light source unit 10111 includes a light source such as, for example, a light emitting diode (LED) and irradiates light on an image pickup field-of-view of the image pickup unit 10112.

The image pickup unit 10112 includes an image pickup element and an optical system including a plurality of lenses provided at a preceding stage to the image pickup element. Reflected light (hereinafter referred to as observation light) of light irradiated on a body tissue which is an observation target is condensed by the optical system and introduced into the image pickup element. In the image pickup unit 10112, the incident observation light is photoelectrically converted by the image pickup element, by which an image signal corresponding to the observation light is generated. The image signal generated by the image pickup unit 10112 is provided to the image processing unit 10113.

The image processing unit 10113 includes a processor such as a central processing unit (CPU) or a graphics processing unit (GPU) and performs various signal processes for an image signal generated by the image pickup unit 10112. The image processing unit 10113 provides the image signal for which the signal processes have been performed thereby as RAW data to the wireless communication unit 10114.

The wireless communication unit 10114 performs a predetermined process such as a modulation process for the image signal for which the signal processes have been performed by the image processing unit 10113 and transmits the resulting image signal to the external controlling apparatus 10200 through an antenna 10114A. Further, the wireless communication unit 10114 receives a control signal relating to driving control of the capsule type endoscope 10100 from the external controlling apparatus 10200 through the antenna 10114A. The wireless communication unit 10114 provides the control signal received from the external controlling apparatus 10200 to the control unit 10117.

The power feeding unit 10115 includes an antenna coil for power reception, a power regeneration circuit for regenerating electric power from current generated in the antenna coil, a voltage booster circuit and so forth. The power feeding unit 10115 generates electric power using the principle of non-contact charging.

The power supply unit 10116 includes a secondary battery and stores electric power generated by the power feeding unit 10115. In FIG. 21, in order to avoid complicated illustration, an arrow mark indicative of a supply destination of electric power from the power supply unit 10116 and so forth are omitted. However, electric power stored in the power supply unit 10116 is supplied to and can be used to drive the light source unit 10111, the image pickup unit 10112, the image processing unit 10113, the wireless communication unit 10114 and the control unit 10117.

The control unit 10117 includes a processor such as a CPU and suitably controls driving of the light source unit 10111, the image pickup unit 10112, the image processing unit 10113, the wireless communication unit 10114 and the power feeding unit 10115 in accordance with a control signal transmitted thereto from the external controlling apparatus 10200.

The external controlling apparatus 10200 includes a processor such as a CPU or a GPU, a microcomputer, a control board or the like in which a processor and a storage element such as a memory are mixedly incorporated. The external controlling apparatus 10200 transmits a control signal to the control unit 10117 of the capsule type endoscope 10100 through an antenna 10200A to control operation of the capsule type endoscope 10100. In the capsule type endoscope 10100, an irradiation condition of light upon an observation target of the light source unit 10111 can be changed, for example, in accordance with a control signal from the external controlling apparatus 10200. Further, an image pickup condition (for example, a frame rate, an exposure value or the like of the image pickup unit 10112) can be changed in accordance with a control signal from the external controlling apparatus 10200. Further, the substance of processing by the image processing unit 10113 or a condition for transmitting an image signal from the wireless communication unit 10114 (for example, a transmission interval, a transmission image number or the like) may be changed in accordance with a control signal from the external controlling apparatus 10200.

Further, the external controlling apparatus 10200 performs various image processes for an image signal transmitted thereto from the capsule type endoscope 10100 to generate image data for displaying a picked up in-vivo image on the display apparatus. As the image processes, various signal processes can be performed such as, for example, a development process (demosaic process), an image quality improving process (bandwidth enhancement process, a super-resolution process, a noise reduction (NR) process and/or image stabilization process) and/or an enlargement process (electronic zooming process). The external controlling apparatus 10200 controls driving of the display apparatus to cause the display apparatus to display a picked up in-vivo image on the basis of generated image data. Alternatively, the external controlling apparatus 10200 may also control a recording apparatus (not depicted) to record generated image data or control a printing apparatus (not depicted) to output generated image data by printing.

The description has been given above of one example of the in-vivo information acquisition system, to which the technology according to the present disclosure is applicable. The technology according to the present disclosure is applicable to, for example, the image pickup unit 10112 of the configurations described above. This makes it possible to acquire a fine operative image, thereby improving accuracy of an inspection.

Application Example 4

<Practical Application Example to Mobile Body>

The technology (present technology) according to the present disclosure is applicable to various products. For example, the technology according to the present disclosure may be achieved in the form of an apparatus to be mounted to a mobile body of any kind such as an automobile, an electric vehicle, a hybrid electric vehicle, a motorcycle, a bicycle, a personal mobility, an airplane, an unmanned aerial vehicle, a vessel, and a robot.

FIG. 22 is a block diagram depicting an example of schematic configuration of a vehicle control system as an example of a mobile body control system to which the technology according to an embodiment of the present disclosure can be applied.

The vehicle control system 12000 includes a plurality of electronic control units connected to each other via a communication network 12001. In the example depicted in FIG. 22, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automatic driving, which makes the vehicle to travel autonomously without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which information is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound and an image to an output device capable of visually or auditorily notifying information to an occupant of the vehicle or the outside of the vehicle. In the example of FIG. 22, an audio speaker 12061, a display section 12062, and an instrument panel 12063 are illustrated as the output device. The display section 12062 may, for example, include at least one of an on-board display and a head-up display.

FIG. 23 is a diagram depicting an example of the installation position of the imaging section 12031.

In FIG. 23, the imaging section 12031 includes imaging sections 12101, 12102, 12103, 12104, and 12105.

The imaging sections 12101, 12102, 12103, 12104, and 12105 are, for example, disposed at positions on a front nose, sideview mirrors, a rear bumper, and a back door of the vehicle 12100 as well as a position on an upper portion of a windshield within the interior of the vehicle. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the sideview mirrors obtain mainly an image of the sides of the vehicle 12100. The imaging section 12104 provided to the rear bumper or the back door obtains mainly an image of the rear of the vehicle 12100. The imaging section 12105 provided to the upper portion of the windshield within the interior of the vehicle is used mainly to detect a preceding vehicle, a pedestrian, an obstacle, a signal, a traffic sign, a lane, or the like.

Incidentally, FIG. 23 depicts an example of photographing ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automatic driving that makes the vehicle travel autonomously without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

Although the description has been given with reference to the first and fifth embodiments, the modification example, and the application examples, the content of the present disclosure is not limited to the foregoing embodiments, etc., and may be modified in a variety of ways. For example, although the solid-state imaging element in the foregoing first embodiment has a configuration in which the organic photoelectric converter 20 detecting the green light and the inorganic photoelectric converters 32B and 32R respectively detecting blue light and red light are stacked, the contents of the present disclosure are not limited to such a configuration. That is, the organic photoelectric converter may detect red light or blue light, and the inorganic photoelectric converter may detect green light.

In addition, the number of organic photoelectric converters, the number of inorganic photoelectric converters, a ratio between the organic photoelectric converters and the inorganic photoelectric converters are not limited, and two or more organic photoelectric converters may be provided, or color signals of a plurality of colors may be obtained by only the organic photoelectric converter. Further, the content of the present disclosure is not limited to a configuration in which organic photoelectric converters and inorganic photoelectric converters are stacked in the longitudinal direction, and organic photoelectric converters and inorganic photoelectric converters may be disposed side by side along a substrate surface.

Furthermore, in the foregoing embodiments, etc., the configuration of the back-side illumination type solid-state imaging apparatus has been exemplified; however, the contents of the present disclosure are applicable to a front-side illumination type solid-state imaging apparatus. In addition, it is not necessary that the solid-state imaging element and the imaging apparatus of the present disclosure include all of the respective components described in the foregoing embodiments, etc., and or may include any other layer.

It is to be noted that the effects described herein are merely illustrative and non-limiting, and other effects may be included.

It is to be noted that the present disclosure may have the following configurations.

(1)
A solid-state imaging element including:
a first electrode including a plurality of electrodes;
a second electrode opposed to the first electrode; and
a photoelectric conversion layer provided between the first electrode and the second electrode,
the first electrode having, at least in a portion, an overlap section where the plurality of electrodes overlap each other with a first insulation layer interposed therebetween.

(2)
The solid-state imaging element according to (1), in which the first electrode includes a charge readout electrode and a charge accumulation electrode as the plurality of electrodes.

(3)
The solid-state imaging element according to (2), in which
the charge readout electrode includes a first electrically-conductive film and a second electrically-conductive film, the first electrically-conductive film being provided in a same layer as the charge accumulation electrode, the second electrically-conductive film being electrically coupled to the first electrically-conductive film and provided in a layer different from the first electrically-conductive film, and
the overlap section includes a portion of the second electrically-conductive film and a portion of the charge accumulation electrode that are stacked with the first insulation layer interposed therebetween.

(4)
The solid-state imaging element according to (2) to (3), in which
the first electrode further includes, as the plurality of electrodes, a charge transfer electrode between the charge readout electrode and the charge accumulation electrode,
the charge transfer electrode includes a third electrically-conductive film and two fourth electrically conductive films, the third electrically-conductive film being provided in a same layer as the charge readout electrode and the charge accumulation electrode, the fourth electrically-conductive films being electrically coupled to the third electrically-conductive film and formed in a layer different from the third electrically-conductive film, and
the two fourth electrically-conductive films form two overlap sections through stacking respective portions of the fourth electrically-conductive films on the charge readout electrode and the charge accumulation electrode with the first insulation layer interposed therebetween.

(5)
The solid-state imaging element according to any one of (2) to (4), in which the charge accumulation electrode is divided into two or more portions, and has the overlap section in which the portions are partially stacked on each other with the first insulation layer interposed therebetween.

(6)
The solid-state imaging element according to any one of (2) to (5), in which
the first electrode further includes a charge discharging electrode adjacent to the charge accumulation electrode,
the charge discharging electrode includes a fifth electrically-conductive film and a sixth electrically-conductive film, the fifth electrically-conductive film being provided in a same layer as the charge accumulation electrode, the sixth electrically-conductive film being electrically coupled to the fifth electrically-conductive film and formed in a layer different from the fifth electrically-conductive film, and
the overlap section includes a portion of the sixth electrically-conductive film and a portion of the charge accumulation electrode that are stacked with the first insulation layer interposed therebetween.

(7)
The solid-state imaging element according to any one of (1) to (6), in which the first electrode is disposed on a side opposite to a light entering surface with respect to the photoelectric conversion layer.

(8)
The solid-state imaging element according to any one of (1) to (7), in which the first electrode is disposed on a side on which a light entering surface is located with respect to the photoelectric conversion layer.

(9)

The solid-state imaging element according to any one of (2) to (8), in which
- a second insulation layer is provided between the first electrode and the photoelectric conversion layer, and
- the charge readout electrode is electrically coupled to the photoelectric conversion layer through an opening provided in the second insulation layer.

(10)

The solid-state imaging element according to (9), in which
- a semiconductor layer is provided between the photoelectric conversion layer and the second insulation layer, and
- the charge readout electrode is electrically coupled to the photoelectric conversion layer through the semiconductor layer.

(11)

The solid-state imaging element according to any one of (1) to (10), in which a voltage is independently applied to each of the plurality of electrodes.

(12)

The solid-state imaging element according to any one of (1) to (11), in which an organic photoelectric converter including one or a plurality of the photoelectric conversion layers, and one or a plurality of inorganic photoelectric converters are stacked, the inorganic photoelectric converters performing photoelectric conversion in a different wavelength range from the organic photoelectric converter.

(13)

The solid-state imaging element according to (11) or (12), in which the inorganic photoelectric converter is formed to be embedded in a semiconductor substrate, and
- the organic photoelectric converter is formed on a side on which a first surface is located of the semiconductor substrate.

(14)

The solid-state imaging element according to (13), in which a multilayer wiring layer is formed on a side on which a second surface is located of the semiconductor substrate.

(15)

The solid-state imaging element according to (13) or (14), in which
- the organic photoelectric converter performs photoelectric conversion of green light, and
- an inorganic photoelectric converter that performs photoelectric conversion of blue light and an inorganic photoelectric converter that performs photoelectric conversion of red light are stacked inside the semiconductor substrate.

(16)

A solid-state imaging apparatus provided with a plurality of pixels each including one or a plurality of solid-state imaging elements, each of the solid-state imaging elements including:
- a first electrode including a plurality of electrodes;
- a second electrode opposed to the first electrode; and
- a photoelectric conversion layer provided between the first electrode and the second electrode,
- the first electrode having, at least in a portion, an overlap section where the plurality of electrodes overlap each other with a first insulation layer interposed therebetween.

(17)

The solid-state imaging apparatus according to (16), in which the first electrode is formed in each of the pixels, and includes the plurality of electrode in the pixel.

It should be understood by those skilled in the art that various modifications, combinations, sub-combinations and alterations may occur depending on design requirements and other factors insofar as they are within the scope of the appended claims or the equivalents thereof.

What is claimed is:

1. A solid-state imaging element, comprising:
    a first electrode including a plurality of electrodes, wherein the plurality of electrodes includes a charge accumulation electrode and a charge readout electrode;
    a second electrode opposed to the first electrode; and
    a photoelectric conversion layer between the first electrode and the second electrode, wherein
        the first electrode has, at least in a portion, a first overlap section where the charge accumulation electrode overlaps with the charge readout electrode with a first insulation layer interposed therebetween,
        the charge accumulation electrode is configured to accumulate a charge generated in the photoelectric conversion layer, and
    the charge readout electrode is configured to readout the charge generated in the photoelectric conversion layer.

2. The solid-state imaging element according to claim 1, wherein
    the charge readout electrode includes a first electrically-conductive film and a second electrically-conductive film,
    the first electrically-conductive film is in a same layer as the charge accumulation electrode,
    the second electrically-conductive film is electrically coupled to the first electrically-conductive film and is in a layer different from the first electrically-conductive film, and
    the first overlap section includes a portion of the second electrically-conductive film and a portion of the charge accumulation electrode that are stacked with the first insulation layer interposed therebetween.

3. The solid-state imaging element according to claim 1, wherein
    the first electrode further includes, as the plurality of electrodes, a charge transfer electrode between the charge readout electrode and the charge accumulation electrode,
    the charge transfer electrode includes a third electrically-conductive film and two fourth electrically-conductive films,
    the third electrically-conductive film is in a same layer as the charge readout electrode and the charge accumulation electrode,
    the two fourth electrically-conductive films are electrically coupled to the third electrically-conductive film and are in a layer different from the third electrically-conductive film, and
    the two fourth electrically-conductive films form two overlap sections through stacking respective portions of the two fourth electrically-conductive films on the charge readout electrode and the charge accumulation electrode with the first insulation layer interposed therebetween.

4. The solid-state imaging element according to claim 1, wherein the charge accumulation electrode is divided into at least two portions, and has a second overlap section in which the at least two portions are partially stacked on each other with the first insulation layer interposed therebetween.

5. The solid-state imaging element according to claim 1, wherein
the first electrode further includes a charge discharging electrode adjacent to the charge accumulation electrode,
the charge discharging electrode includes a fifth electrically-conductive film and a sixth electrically-conductive film,
the fifth electrically-conductive film is in a same layer as the charge accumulation electrode,
the sixth electrically-conductive film is electrically coupled to the fifth electrically-conductive film and is in a layer different from the fifth electrically-conductive film, and
the first overlap section includes a portion of the sixth electrically-conductive film and a portion of the charge accumulation electrode that are stacked with the first insulation layer interposed therebetween.

6. The solid-state imaging element according to claim 1, wherein the first electrode is on a side opposite to a light entering surface with respect to the photoelectric conversion layer.

7. The solid-state imaging element according to claim 1, wherein the first electrode is on a side on which a light entering surface is located with respect to the photoelectric conversion layer.

8. The solid-state imaging element according to claim 1, further comprising a second insulation layer between the first electrode and the photoelectric conversion layer,
wherein the charge readout electrode is electrically coupled to the photoelectric conversion layer through an opening in the second insulation layer.

9. The solid-state imaging element according to claim 8, further comprising a semiconductor layer between the photoelectric conversion layer and the second insulation layer,
wherein the charge readout electrode is electrically coupled to the photoelectric conversion layer through the semiconductor layer.

10. The solid-state imaging element according to claim 1, wherein a voltage is independently applied to each of the plurality of electrodes.

11. The solid-state imaging element according to claim 1, further comprising:
an organic photoelectric converter including a plurality of photoelectric conversion layers, and
a plurality of inorganic photoelectric converters configured to perform photoelectric conversion in a different wavelength range from the organic photoelectric converter.

12. The solid-state imaging element according to claim 11, wherein
the plurality of inorganic photoelectric converters is embedded in a semiconductor substrate, and
the organic photoelectric converter is on a side of a first surface of the semiconductor substrate.

13. The solid-state imaging element according to claim 12, further comprising a multilayer wiring layer on a side of a second surface is of the semiconductor substrate.

14. The solid-state imaging element according to claim 12, wherein
the organic photoelectric converter is configured to perform the photoelectric conversion of green light,
a first inorganic photoelectric converter of the plurality of inorganic photoelectric converters is configured to perform the photoelectric conversion of blue light, and
a second inorganic photoelectric converter of the plurality of inorganic photoelectric converters is configured to perform the photoelectric conversion of red light.

15. A solid-state imaging apparatus, comprising:
a plurality of pixels each including at least one solid-state imaging element, ach of the at least one solid-state imaging element including:
a first electrode including a plurality of electrodes, wherein the plurality of electrodes includes a charge accumulation electrode and a charge readout electrode;
a second electrode opposed to the first electrode; and
a photoelectric conversion layer between the first electrode and the second electrode, wherein
the first electrode has, at least in a portion, an overlap section where the charge accumulation electrode overlaps with the charge readout electrode with a first insulation layer interposed therebetween,
the charge accumulation electrode is configured to accumulate a charge generated in the photoelectric conversion layer, and
the charge readout electrode is configured to readout the charge generated in the photoelectric conversion layer.

16. The solid-state imaging apparatus according to claim 15, wherein the first electrode is in each of the plurality of pixels.

* * * * *